(12) United States Patent
Benoit et al.

(10) Patent No.: US 8,267,719 B1
(45) Date of Patent: *Sep. 18, 2012

(54) PLUG TAIL LIGHTING SWITCH AND CONTROL SYSTEM

(75) Inventors: John Benoit, Montpelier, NY (US); Gerald R. Savicki, Jr., Canastota, NY (US); Richard Weeks, Little York, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 200 days.

This patent is subject to a terminal disclaimer.

(21) Appl. No.: 12/861,619

(22) Filed: Aug. 23, 2010

Related U.S. Application Data

(63) Continuation of application No. 12/123,866, filed on May 20, 2008, now Pat. No. 7,780,470, which is a continuation-in-part of application No. 11/531,812, filed on Sep. 14, 2006, now Pat. No. 7,713,084, which is a continuation-in-part of application No. 11/274,817, filed on Nov. 15, 2005, now Pat. No. 7,407,410, and a continuation-in-part of application No. 11/032,420, filed on Jan. 10, 2005, now Pat. No. 7,189,110, said application No. 11/274,817 is a continuation of application No. 10/680,797, filed on Oct. 7, 2003, now Pat. No. 6,994,585, said application No. 11/032,420 is a continuation of application No. 10/680,797, filed on Oct. 7, 2003, now Pat. No. 6,994,585.

(51) Int. Cl.
*H01R 13/68* (2011.01)
(52) U.S. Cl. ......................... 439/535; 439/536
(58) Field of Classification Search .................. 439/535, 439/536, 650; 174/48, 66, 67, 50, 53, 68; 220/241
See application file for complete search history.

(56) References Cited

U.S. PATENT DOCUMENTS 2,433,917 A    1/1948   McCartney
(Continued)

OTHER PUBLICATIONS

Ricter et al., Practical Electrical Wiring, 1993, 16th Edition, McGraw-Hill, U.S.; pp. 137-139, 176-177, 507-510.
(Continued)

*Primary Examiner* — Tho D Ta
(74) *Attorney, Agent, or Firm* — Daniel P. Malley; Bond Schoeneck & King

(57) ABSTRACT

The present invention is directed to an electrical wiring system for use in an AC electrical power distribution circuit including at least one first AC power conductor disposed between an upstream AC power element and a device box and at least one second AC power conductor disposed between the device box and a downstream AC power element. The at least one first AC power conductor and the at least one second AC power conductor are routed into an interior portion of the device box and accessible via a front open face of the device box. The system includes a connector device including a connector housing having a plurality of connector contacts disposed therein. The plurality of connector contacts are coupled to termination structures configured to couple the at least one first AC power conductor and the at least one second AC power conductor to corresponding contacts of the plurality of connector contacts. An electrical wiring device includes a device housing having a front portion and a rear portion. The front portion includes at least one user-accessible control element disposed thereon. The at least one user-accessible control element is coupled to an electrical switch mechanism disposed in the device housing and coupled to a plurality of device contacts. The plurality of device contacts are accessible by way of a device connection arrangement formed in the rear portion of the device housing. The plurality of device contacts are configured to mate with the plurality of connector contacts when the connector device is coupled to the device connection arrangement.

50 Claims, 26 Drawing Sheets

U.S. PATENT DOCUMENTS

| | | | |
|---|---|---|---|
| 2,895,119 A | 7/1959 | Montgomery, Jr. | |
| 3,156,761 A | 11/1964 | Schinske | |
| 3,192,499 A | 6/1965 | West | |
| 3,369,211 A | 2/1968 | Sundquist | |
| 3,641,472 A | 2/1972 | Phillips, Jr. | |
| 3,746,923 A | 7/1973 | Spira et al. | |
| 3,798,506 A | 3/1974 | English | |
| 3,879,101 A | 4/1975 | McKissic | |
| 3,952,244 A | 4/1976 | Spear | |
| 3,967,195 A | 6/1976 | Averitt et al. | |
| 3,975,074 A | 8/1976 | Fuller | |
| 3,975,075 A | 8/1976 | Mason | |
| 4,008,940 A | 2/1977 | Foley | |
| 4,015,201 A | 3/1977 | Chaffee | |
| 4,034,284 A | 7/1977 | Peplow et al. | |
| 4,082,995 A | 4/1978 | Rhude | |
| 4,105,968 A | 8/1978 | Mobley et al. | |
| 4,118,690 A | 10/1978 | Paynton | |
| 4,127,807 A | 11/1978 | Peplow et al. | |
| 4,152,639 A | 5/1979 | Chaffee | |
| 4,203,638 A | 5/1980 | Tansi | |
| 4,217,619 A | 8/1980 | Tibolla | |
| 4,273,957 A | 6/1981 | Kolling, Jr. | |
| 4,280,092 A | 7/1981 | Wells, Jr. et al. | |
| 4,329,678 A | 5/1982 | Hatfield | |
| 4,477,141 A | 10/1984 | Hardesty | |
| 4,485,282 A | 11/1984 | Lee | |
| 4,725,249 A | 2/1988 | Blackwood et al. | |
| 4,725,429 A | 2/1988 | Scott et al. | |
| 4,842,551 A | 6/1989 | Heimann | |
| 4,865,556 A | 9/1989 | Campbell et al. | |
| 4,880,950 A | 11/1989 | Carson et al. | |
| 4,924,349 A | 5/1990 | Buehler et al. | |
| 4,939,383 A | 7/1990 | Tucker et al. | |
| RE33,504 E | 12/1990 | Yuhasz et al. | |
| 4,988,840 A | 1/1991 | Carson et al. | |
| 5,006,075 A | 4/1991 | Bowden, Jr. | |
| 5,015,203 A | 5/1991 | Furrow | |
| 5,117,122 A | 5/1992 | Hogarth et al. | |
| 5,146,385 A | 9/1992 | Misencik | |
| 5,178,555 A | 1/1993 | Kilpatrick et al. | |
| 5,224,009 A | 6/1993 | Misencik | |
| 5,262,678 A | 11/1993 | Flowers et al. | |
| 5,266,039 A | 11/1993 | Boyer et al. | |
| 5,281,154 A | 1/1994 | Comerci et al. | |
| 5,285,163 A | 2/1994 | Liotta | |
| 5,297,973 A | 3/1994 | Gorman | |
| 5,359,231 A | 10/1994 | Flowers et al. | |
| 5,456,373 A | 10/1995 | Ford | |
| 5,472,350 A | 12/1995 | Mehta | |
| 5,582,522 A | 12/1996 | Johnson | |
| 5,625,285 A | 4/1997 | Virgilio | |
| 5,642,052 A | 6/1997 | Earle | |
| 5,654,857 A | 8/1997 | Gershen | |
| 5,785,551 A | 7/1998 | Libby | |
| 5,839,908 A | 11/1998 | Bonilla et al. | |
| 5,876,243 A | 3/1999 | Sangawa | |
| 5,964,618 A | 10/1999 | McCarthy | |
| 6,005,308 A | 12/1999 | Bryde et al. | |
| 6,028,268 A | 2/2000 | Stark et al. | |
| 6,045,374 A | 4/2000 | Candeloro | |
| 6,054,849 A | 4/2000 | Collier et al. | |
| 6,072,317 A | 6/2000 | Mackenzie | |
| 6,156,971 A | 12/2000 | May | |
| 6,218,844 B1 | 4/2001 | Wong et al. | |
| 6,259,351 B1 * | 7/2001 | Radosavljevic et al. | 338/176 |
| 6,309,248 B1 | 10/2001 | King | |
| 6,323,652 B1 | 11/2001 | Collier et al. | |
| 6,341,981 B1 | 1/2002 | Gorman | |
| 6,376,770 B1 | 4/2002 | Hyde | |
| 6,377,427 B1 | 4/2002 | Haun et al. | |
| 6,457,988 B1 | 10/2002 | Andersen | |
| 6,494,728 B1 | 12/2002 | Gorman | |
| 6,563,049 B2 | 5/2003 | May | |
| 6,657,144 B2 | 12/2003 | Savicki, Jr. et al. | |
| 6,692,284 B1 | 2/2004 | Koh | |
| 6,753,471 B2 | 6/2004 | Johnson et al. | |
| 6,767,245 B2 | 7/2004 | King | |
| 6,774,307 B2 | 8/2004 | Kruse et al. | |
| 6,814,611 B1 | 11/2004 | Torres | |
| 6,843,680 B2 | 1/2005 | Gorman | |
| 6,870,099 B1 * | 3/2005 | Schultz et al. | 174/53 |
| 6,884,111 B2 | 4/2005 | Gorman | |
| 6,939,179 B1 | 9/2005 | Kieffer, Jr. et al. | |
| 6,982,558 B2 | 1/2006 | Bryndzia et al. | |
| 6,994,585 B2 | 2/2006 | Benoit et al. | |
| 7,052,313 B2 | 5/2006 | Gorman | |
| 7,057,401 B2 | 6/2006 | Blades | |
| 7,068,038 B2 | 6/2006 | Mason et al. | |
| 7,091,723 B2 | 8/2006 | Simmons et al. | |
| 7,195,517 B1 | 3/2007 | Savicki, Jr. | |
| 7,199,587 B2 | 4/2007 | Hurwicz | |
| 7,259,567 B2 | 8/2007 | Sears et al. | |
| 7,265,291 B1 | 9/2007 | Gorman | |
| 7,332,683 B2 | 2/2008 | Gorman | |
| 7,367,121 B1 | 5/2008 | Gorman | |
| 7,497,582 B1 * | 3/2009 | Savicki, Jr. | 362/95 |
| 7,762,838 B2 | 7/2010 | Gorman | |
| 7,780,470 B2 * | 8/2010 | Benoit et al. | 439/535 |
| 2002/0052139 A1 | 5/2002 | Gorman | |
| 2002/0055301 A1 | 5/2002 | Gorman | |
| 2005/0006124 A1 | 1/2005 | Kruse et al. | |
| 2005/0250377 A1 | 11/2005 | Gorman | |
| 2005/0250378 A1 | 11/2005 | Gorman | |
| 2005/0272305 A1 | 12/2005 | Gorman | |
| 2007/0072487 A1 | 3/2007 | Gorman | |
| 2008/0020632 A1 | 1/2008 | Gorman | |
| 2008/0235943 A1 | 10/2008 | Gorman | |
| 2010/0218374 A1 | 9/2010 | Gorman | |
| 2010/0218969 A1 | 9/2010 | Purves et al. | |

OTHER PUBLICATIONS

Bryant Wiring Device Catalog BDB-1506, May 1994, pp. C12, D12, D16, F2 and F5.

Leviton Wiring Device Catalog, D-200, 1978, Little Neck, NY, pp. C1, T9, T12.

Pass & Seymour Plug Tail Wiring Devices Brochure; Apr. 2004.

First Alert, User's Manual for Smoke and Fire Alarms, Jul. 2004; Mexico, pp. 1-6.

Earley et al., NEC 1999 National Electrical Code Handbook, NFPA, 8th ed. (1999) pp. v-vii, 2, 69-70 and 98.

BRK Electronics, User's Manual—Smoke Alarms Jun. 2000.

T. Engdahl, Telephone Ringing Circuits, 1997, www.tkk.fi/misc/electronics/circuits/telephone.sub.—ringer.html.

P&S PlugTail Installation—Speed Comparison Video, Pass & Seymour website (www.passandseymour.com/plugtail/video.cfm, Jun. 2007.

BRK Electronics (First Alert), Model SC6120B—Users Manual for AC Powered Smoke and Carbon Monoxide Alarm with Batter Back-Up and Silence Feature, 2001.

National Electrical Code Handbook; Article 314, 314-17-314.20; Outlet, Device Pull, and Junction Boxes; Conduit bodies, Fittings; and Handhole Enclosures; 2005; p. 327.

* cited by examiner

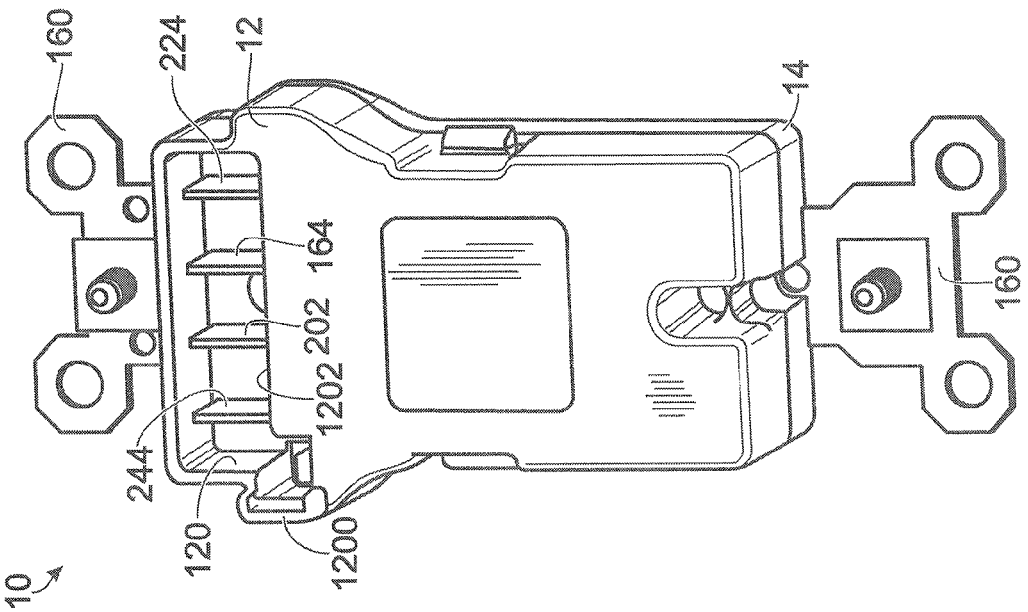
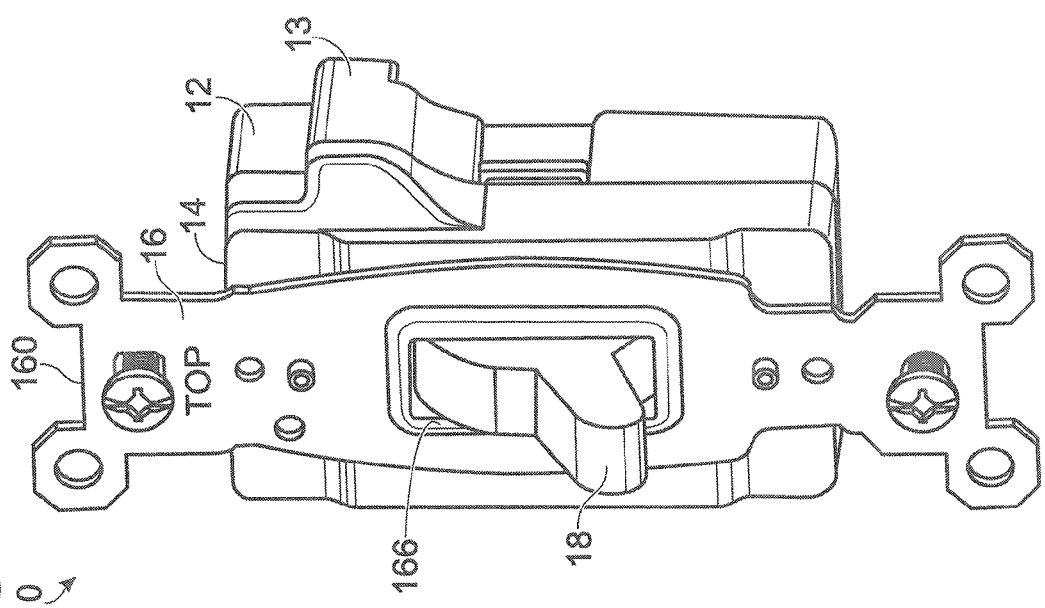

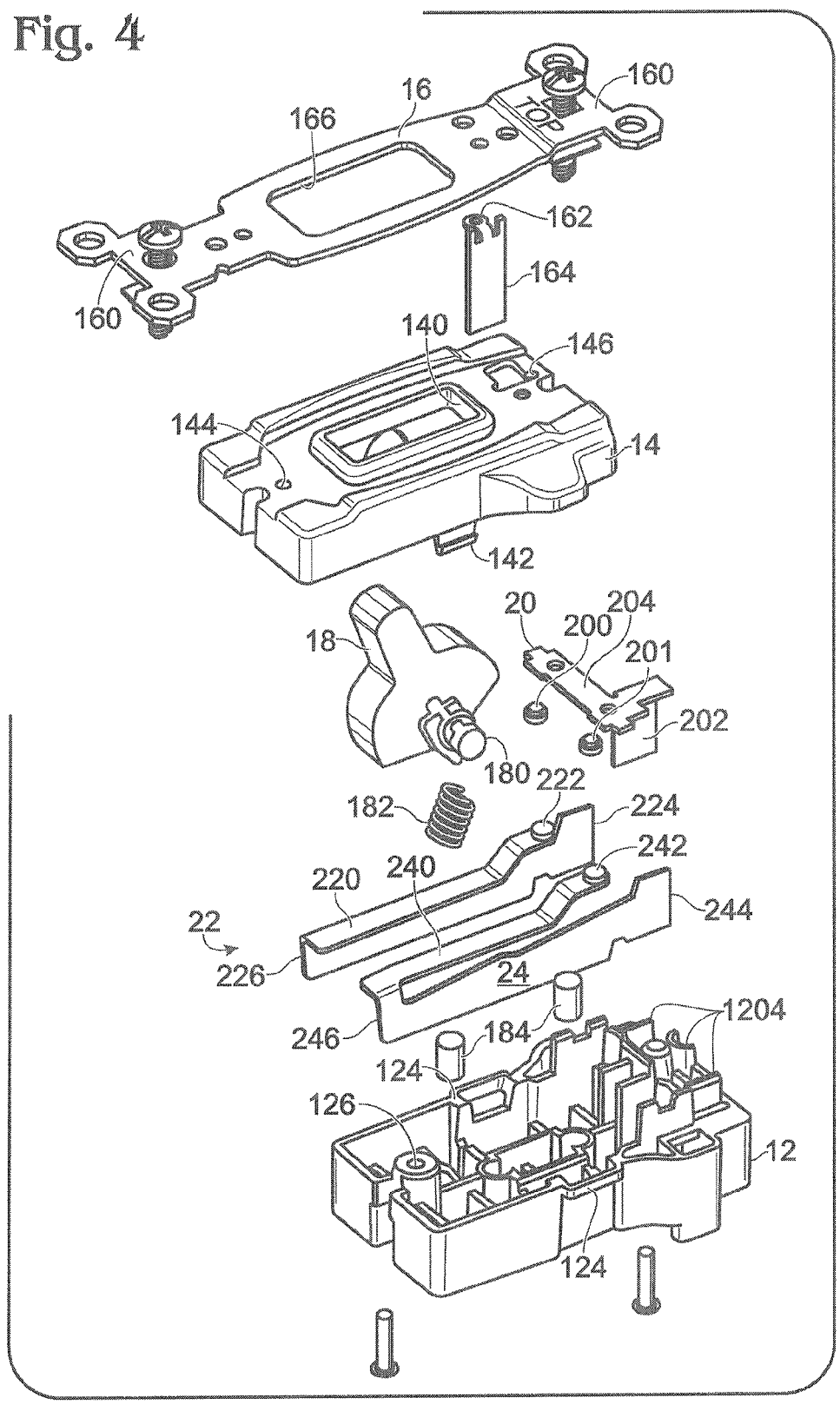

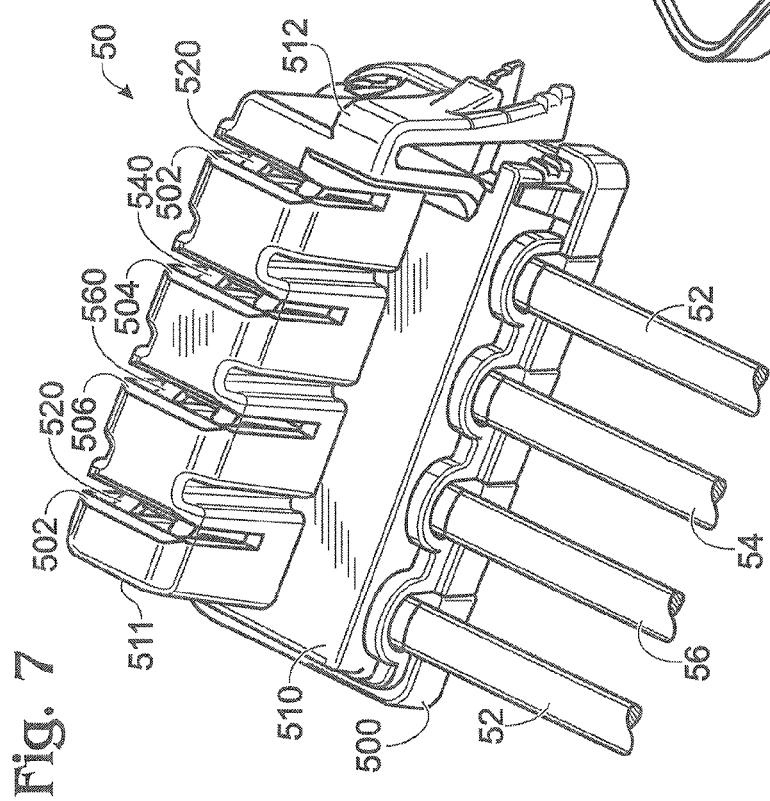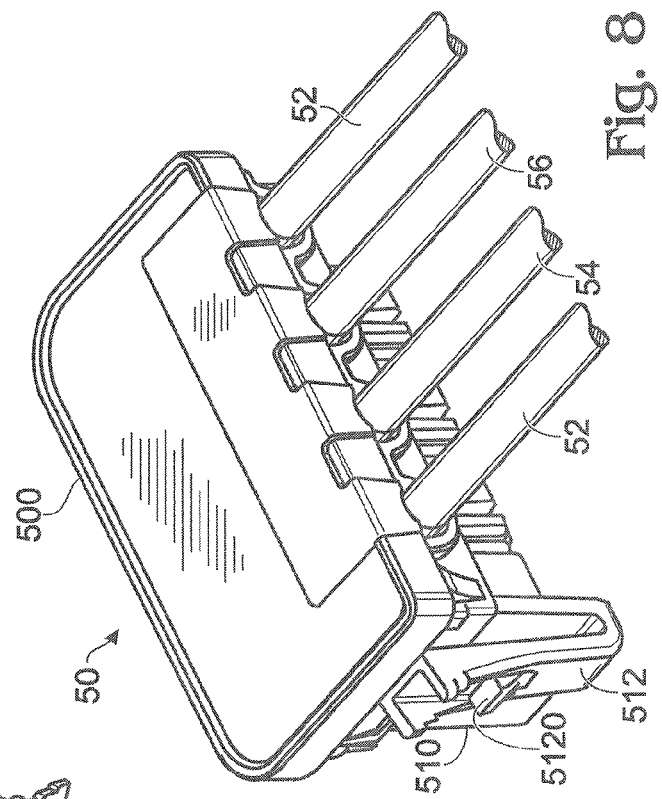

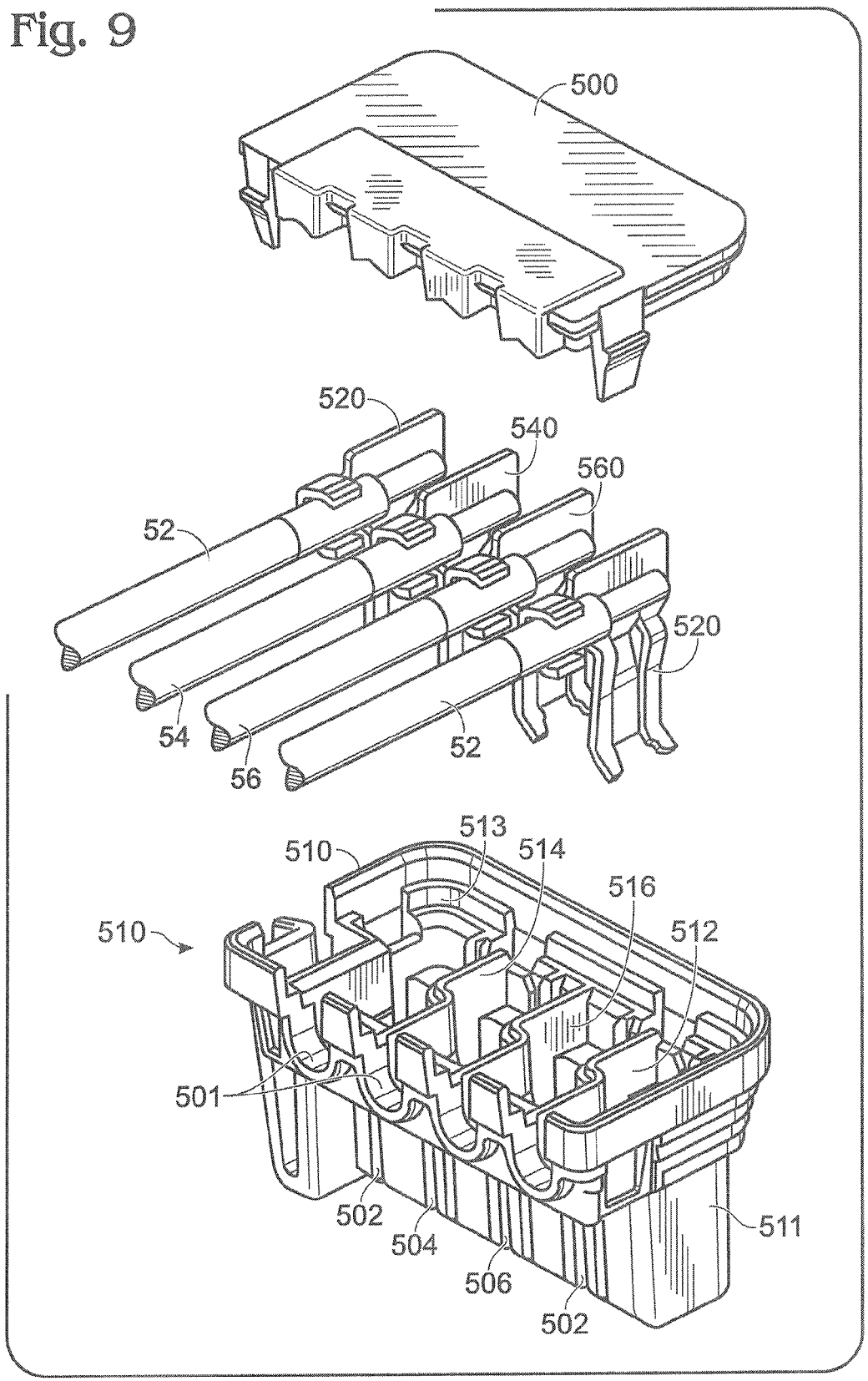

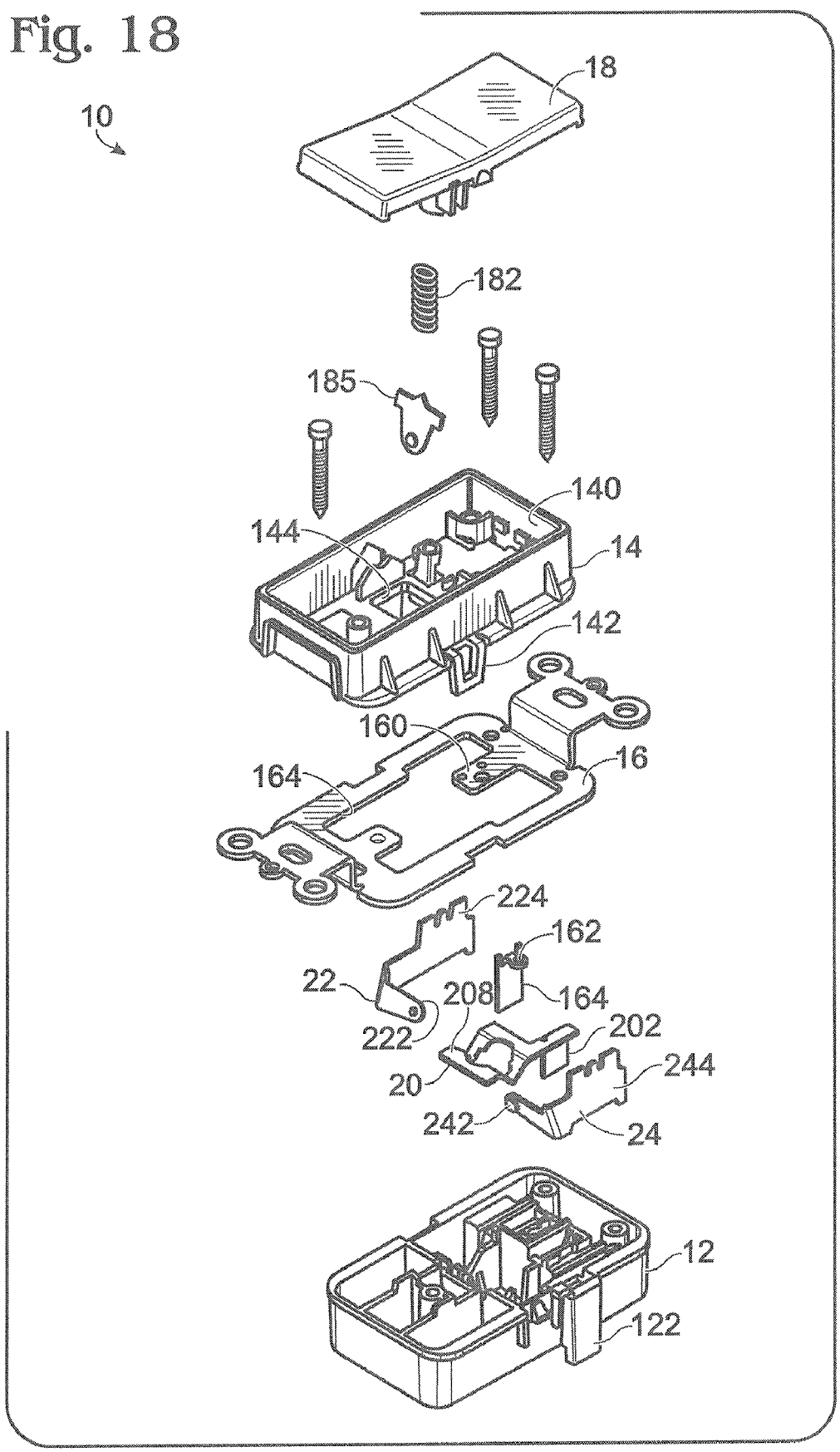

PLUG TAIL LIGHTING SWITCH AND CONTROL SYSTEM

CROSS-REFERENCE TO RELATED APPLICATIONS

This is a continuation of U.S. patent application Ser. No. 12/123,866 filed on May 20, 2008, which is a continuation-in-part of U.S. patent application Ser. No. 11/531,812 filed on Sep. 14, 2006, which is a continuation-in-part application of U.S. patent application Ser. No. 11/274,817 filed on Nov. 15, 2005 and U.S. patent application Ser. No. 11/032,420 filed on Jan. 10, 2005, both of which are continuation applications of U.S. patent application Ser. No. 10/680,797 filed on Oct. 7, 2003, the contents of which are relied upon and incorporated herein by reference in their entirety, and the benefit of priority under 35 U.S.C. §120 is hereby claimed.

BACKGROUND OF THE INVENTION

1. Field of the Invention

The present invention relates generally to electrical circuit installation, and particularly to electrical switching systems with features facilitating rapid and safe installation.

2. Technical Background

Installing electrical circuits in buildings and/or other structures is typically labor intensive, time-consuming, and a process that requires electricians of various skill levels. As a result the installation process is expensive. The first phase of the installation is commonly referred to as the "rough-in" phase. In new construction, either conduit or armored cable is disposed through out the structure in accordance with the building plans. Junction boxes are installed at appropriate locations, and brackets and metal device boxes are installed throughout the structure where electrical service is desired. Junction boxes, of course, are employed to house the connection point, or junction, of several conductors. Metal device boxes are used to accommodate electrical wiring devices. For example, the types of electrical wiring devices may include, but are not limited to, receptacles, switches, dimmers, GFCIs, AFCIs, transient voltage surge suppressors (TVSS), protective devices, timer devices, sensors of various types including occupancy sensors, thermostats, lighting fixtures, and/or combinations thereof. Wiring devices such as those listed that employ a switch are herein defined as switching devices. After the boxes are placed, the electrical wires are pulled through the conduits and all of the circuits are bonded. At this point, the leads from the electrical wires extend from the boxes and are visible and accessible for the next phase of the installation process.

Before discussing the next phase of the process, it is noted that electrical cables may include two to five conductive wires. For example, in a structure that requires high power, the most common way of distributing that power is by employing the three-phase power system. As those of ordinary skill in the art recognize, five wires are employed. Three phase power includes three "hot" or "live" wires. Each of these wires transmits electrical power that is 120 degrees out of phase with the other two hot wires. The other two wires are the neutral conductor and the ground wire. Three phase power typically comes from the power utility via four wires: the three-phase wires, and the neutral. If the current flowing through each of the phases is equal, no current will flow through the neutral. The neutral wire is typically connected to the building ground at the structure's main distribution panel. The five wire cable is distributed from the central panel. Some of the circuits in the structure are designed to provide power to grounded equipment. These circuits may employ three wires, a line conductor (hot wire), a neutral conductor, and a ground. Some circuits may only employ two wires, the line conductor and the neutral conductor.

Referring back to the installation process, after the "rough-in" phase has been completed, the electrical wiring devices are terminated, i.e., they are electrically connected to the wire leads. This part of the installation process is the most costly and time consuming A journeyman electrician must perform, or supervise, the connection of each wiring device in the structure. In this process, each electrical wire must be stripped and terminated to the device.

What is needed is an efficient, labor-saving, and cost effective means for terminating the electrical wires and coupling them to the individual switching devices. Further, when the process involves the installation of electrical light switches, the electrical wiring and the light fixtures are in place before the switching devices are installed. Thus, the contractor cannot use the previously installed lighting and instead must rely on temporary lighting while the work proceeds. What is also needed, is a safe and reliable way of taking advantage of the installed electrical wiring and lighting even before the light switches themselves have been installed.

SUMMARY OF THE INVENTION

The present invention addresses the needs described above by providing an efficient, labor-saving, and cost effective means for terminating the electrical wires and coupling them to the individual switching devices. The present invention addresses the problems described above. The present invention is directed to an electrical wiring system that simplifies the installation process. Further, the present invention provides an efficient system and method for terminating electrical devices. The system and method is cost-effective because it eliminates many of the labor intensive practices that are currently in use. In addition, the present invention provides a safe and reliable way of taking advantage of the installed electrical wiring and lighting even before the light switches themselves have been installed.

One aspect of the present invention is directed to an electrical wiring system for use in an AC electrical power distribution circuit including at least one first AC power conductor disposed between an upstream AC power element and a device box and at least one second AC power conductor disposed between the device box and a downstream AC power element. The at least one first AC power conductor and the at least one second AC power conductor are routed into an interior portion of the device box and accessible via a front open face of the device box. The system includes a connector device including a connector housing having a plurality of connector contacts disposed therein. The plurality of connector contacts are coupled to termination structures configured to couple the at least one first AC power conductor and the at least one second AC power conductor to corresponding contacts of the plurality of connector contacts. An electrical wiring device includes a device housing having a front portion and a rear portion. The front portion includes at least one user-accessible control element disposed thereon. The at least one user-accessible control element is coupled to an electrical switch mechanism disposed in the device housing and coupled to a plurality of device contacts. The plurality of device contacts are accessible by way of a device connection arrangement formed in the rear portion of the device housing. The plurality of device contacts are configured to mate with the plurality of connector contacts when the connector device is coupled to the device connection arrangement.

In another aspect, the present invention includes an electrical wiring system for use in an AC electrical power distribution circuit including at least one first AC power conductor disposed between an upstream AC power element and a device box and at least one second AC power conductor disposed between the device box and a downstream AC power element. The at least one first AC power conductor and the at least one second AC power conductor are routed into an interior portion of the device box and accessible via a front open face of the device box. The system includes a connector device having a connector housing having a plurality of connector contacts disposed therein. The plurality of connector contacts are coupled to termination structures configured to couple the first plurality of AC power conductors and the second plurality of AC power conductors to corresponding contacts of the plurality of connector contacts. An electrical wiring device includes a device housing having a front portion and a rear portion. The front portion includes at least one user-accessible control element disposed thereon. The at least one user-accessible control element is coupled to an electrical circuit mechanism disposed in the device housing and coupled to a plurality of device contacts. The electrical circuit mechanism is configured to be switched between a first circuit state and a second circuit state. The plurality of device contacts are accessible by way of a device connection arrangement formed in the rear portion of the device housing. The plurality of device contacts are configured to mate with the plurality of connector contacts when the connector device is coupled to the device connection arrangement.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIG. 2 is a perspective view of a toggle switch device in accordance with an embodiment of the present invention;

FIG. 3 is a perspective view of a back portion of the toggle switch device shown in FIG. 2;

FIG. 4 is an exploded view of the toggle switch device depicted in FIG. 2;

FIG. 7 is a perspective view of a front portion of the connector device shown in FIG. 6;

FIG. 8 is a perspective view of a back portion of the connector device depicted in FIG. 7;

FIG. 9 is an exploded view of the connector device depicted in FIG. 7;

FIG. 18 is an exploded view of a rocker switch device in accordance with an alternate embodiment of the present invention;

DETAILED DESCRIPTION

Figure 1A:
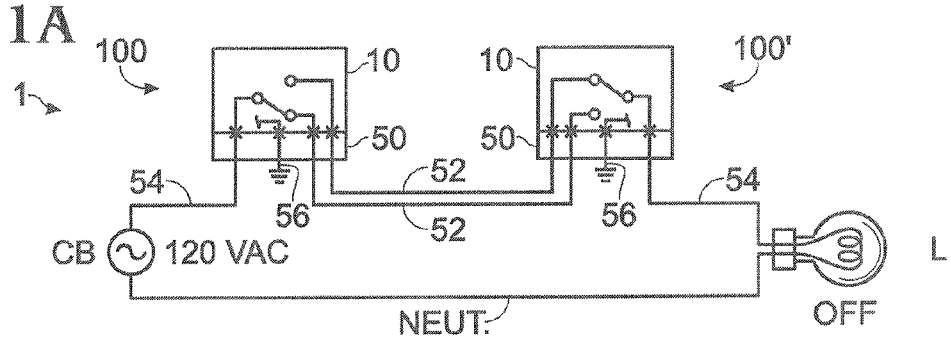
FIGS. 1A-1D are schematic diagrams of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the system of the present invention is shown in FIG. 1, and is designated generally throughout by reference numeral 100.

The present invention is directed to an electrical wiring system for use in an AC electrical power distribution circuit that includes one or more AC power conductors disposed between an upstream AC power element and a device box and one or more AC power conductors disposed between the device box and a downstream AC power element. The "upstream" AC power conductors and the "downstream" AC power conductors are routed into an interior portion of the device box and accessible via a front open face of the device box. The upstream AC power element referred to above may be the circuit breaker panel, an AC distribution point, an electrical wiring device or another electrical wiring system of the type described herein. The downstream AC power element may be an electrical load, an electrical wiring device or another electrical wiring system of the type described previously.

The electrical wiring system 100 of the present invention includes a connector device 50 that has a connector housing having a plurality of connector contacts disposed therein. The plurality of connector contacts are coupled to termination structures configured to couple the one or more upstream AC power conductors and the one or more downstream AC power conductors to corresponding contacts of the plurality of connector contacts. The system 100 also includes an electrical wiring device 10 that has a device housing having a front portion and a rear portion. The front portion includes at least one user-accessible control element disposed thereon. The user-accessible control element is coupled to an electrical switch mechanism disposed in the device housing and coupled to a plurality of device contacts. The plurality of device contacts are accessible by way of a device connection arrangement formed in the rear portion of the device housing. The plurality of device contacts are configured to mate with the plurality of connector contacts when the connector device is coupled to the device connection arrangement.

Accordingly, the present invention may be employed in a number of different ways and configurations. For example, the electrical wiring system of the present invention may be used to implement single pole single throw switch systems, single pole double throw (three-way) switch systems, four way switch systems, electrical wiring systems (such as duplex outlets or GFCIs) having feed-through capabilities. Feed-through, of course, refers to the ability to connect a device or system between line conductors (hot and neutral) and load conductors (hot and neutral).

Figure 1B:
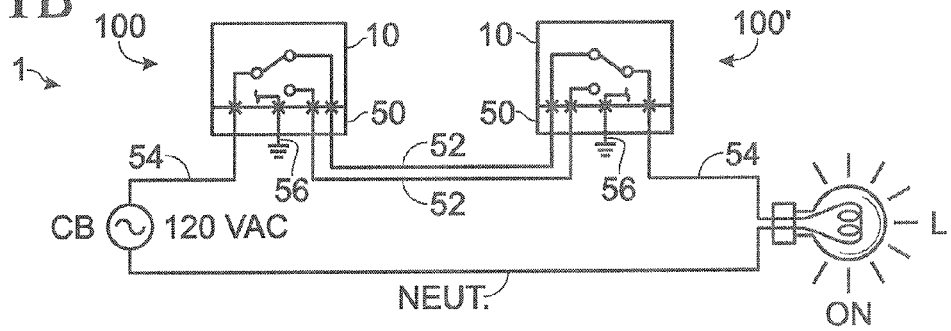
Figure 1C:
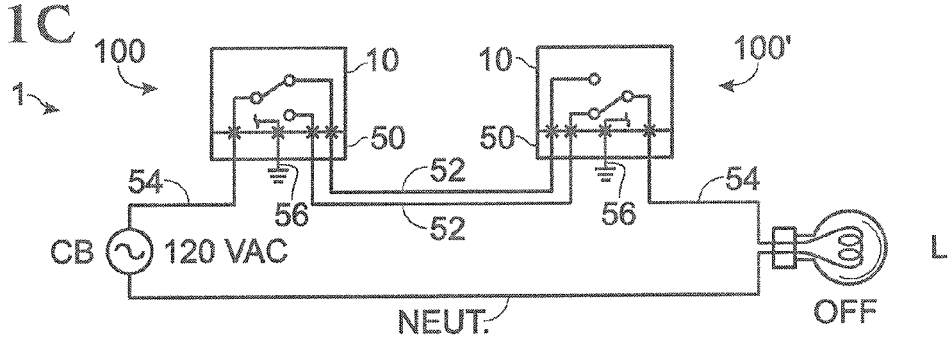
Figure 1D:
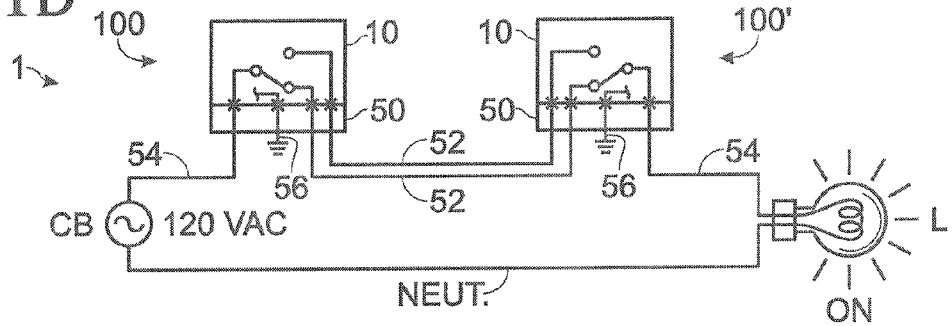

Referring to FIGS. 1A-1D, schematic diagrams in accordance with one exemplary embodiment of the present invention are disclosed. In this example embodiment, the present invention is used to realize a three-way switch 100 that may be employed in an AC branch circuit 1 to control a light from two (or more) locations. A first system 100 is connected to an upstream circuit breaker CB by way of common conductor 54. A ground conductor 56 is show schematically; in practice, it is typically connected to the ground strap in device 10 via the connector device 50. The first system 100 is also connected to two traveler conductors 52 which extend between the first system 100 and the second system 100'. The second system 100' is connected to load L via common conductor 54. The load L is, of course, connected to a neutral conductor that extends back to the circuit breaker CB to complete the circuit. In FIG. 1A, the switch systems 100 and 100' are positioned such that the light L is OFF. In FIG. 1B, switch system 100 is actuated at its location to provide power to light L to turn it ON. In FIG. 1C, switch system 100' is actuated to turn the light OFF. Finally, FIG. 1D shows system 100 being switched to its original position in FIG. 1A, to turn the light L back ON.

As embodied herein, and depicted in FIG. 2, a perspective view of a toggle switch device 10 in accordance with an embodiment of the present invention is disclosed. This embodiment is directed to a three-way switch that may be employed in the scenario provided above with respect to FIGS. 1A-1D. Toggle switch 10 includes a back body member 12 that is connected to a front cover portion 14, that collectively forms the device housing. A ground strap 16 is disposed over the front cover 16. The ground strap 16 includes mounting ears 160 on either end thereof, and a central aperture 166 that accommodates toggle switch mechanism 18. The switch housing is formed to include a winged portion 13 that accommodates various parts of the switch device 10. The winged portion 13, of course, may be eliminated by making the wiring device 10 wider.

Referring to FIG. 3, a perspective view of a back portion of the toggle switch device 10 shown in FIG. 2 is disclosed. The back body 12 includes a device connection arrangement 120 formed at one end thereof. In this example, the device connection arrangement is implemented as a rear receptacle 120 that provides access to the device contacts (164, 202, 224, 244) which are recessed within the receptacle 120. The receptacle 120 also includes a female latching mechanism 1200 formed in one side thereof. The latching mechanism 1200 receives a corresponding male latch member 512 disposed on the connector device (See FIG. 12, for example). In another embodiment of the present invention, the connection arrangement includes various ribbed features formed in the back body 12 in the shape of connector device 50. The device contacts extend from the back of device 10 in this embodiment (not shown).

It should be noted that the receptacle 120 is disposed at one end of the device to ensure that the overall thickness of the wiring device 10 is as small as possible. The device contacts (164, 202, 224, 244) are separated within receptacle 120 from the switch mechanism by a non-conductive barrier 1202. Of course, it is entirely feasible to position the receptacle 120 in a center portion of the device by increasing the thickness of the back body.

Referring to FIG. 4, an exploded view of the toggle switch device depicted in FIG. 2 is disclosed. The front cover 14 includes a central aperture 140 that accommodates toggle switch actuator 18. A second aperture 146 provides the device ground contact 164 with an egress point into the interior of the housing. Of course, device ground contact 164 is ultimately positioned within the rear receptacle 120 (FIG. 3). The device ground contact is connected to the ground strap 16 by tab 162, which is fastened thereto.

The electrical switch mechanism includes stationary common structure 20, traveler structure 22 and traveler structure 24. The common member 20 includes two fixed contacts 200, 201 disposed on a stationary bridge 204. The stationary bridge 204 is connected to the device common contact 202 which is disposed within the rear receptacle 120 (See FIG. 3). Traveler member 22 includes a stationary side-rail 226 that is connected to a flex arm 220 at one end and a device traveler contact 224 at the other end thereof. The flex arm 220 includes a movable contact 222 disposed at the free cantilevered end of the flex arm 220. The movable contact 222, of course, is aligned with fixed contact 200. This contact pair (200, 222) is opened or closed in accordance with the position of the toggle switch actuator 18. The traveler structure 24 is a mirror image of structure 22. Therefore, no further explanation is required other than to say that movable contact 242 and fixed contact 201 form the second switch pair.

The toggle actuator 18 includes a cammed portion 180 that ensures that only one contact pair (200, 222 or 201, 242) is closed at a time. When the actuator 18 is at the limit of rotation in one direction, the movable contact 222 on traveler 22 mates with stationary contact 200 on the common member 20. When the toggle actuator 18 is at the opposite limit of rotation, the cam 180 on the other side of the actuator 18 causes the movable contact 242 on traveler 24 to mate with stationary contact 201 on the common member 20. Because the cams 180 are staggered relative to each other, only one of the flex arm contacts is connected to the common member at any one time. Finally, please note that the spring 182 disposed under the toggle actuator 18 causes it to "snap" between into position toward one end of device 10 or the other.

Note that in the embodiment depicted in FIG. 4, the side-rail is longer than the flex arm. This provides spatial separation between receptacle 120 and the electrical switch mechanism. The device traveler contacts (224, 244) are implemented by blade structures integrally formed at the extended ends of the travelers. The device common contact 202 and the device ground contact 164 are also implemented as blade structures. When the switch 10 is fully assembled, the blades (164, 202, 224, 244) are positioned in the rear receptacle 120 to mate with the connector contacts disposed in the connector device 50. The back body 12 includes plastic walls 1204 that isolate the device contacts (164, 202, 224, 244) from each other.

One purpose of the rear receptacle 120 is to shelter the blade terminals when the connector device 50 is being inserted. One feature of the present invention is that, unlike devices that feature screw terminals, connector device 50 may be mated with the device contacts in receptacle 120 when the conductors terminated by connection device 50 are electrically live.

Figure 5:
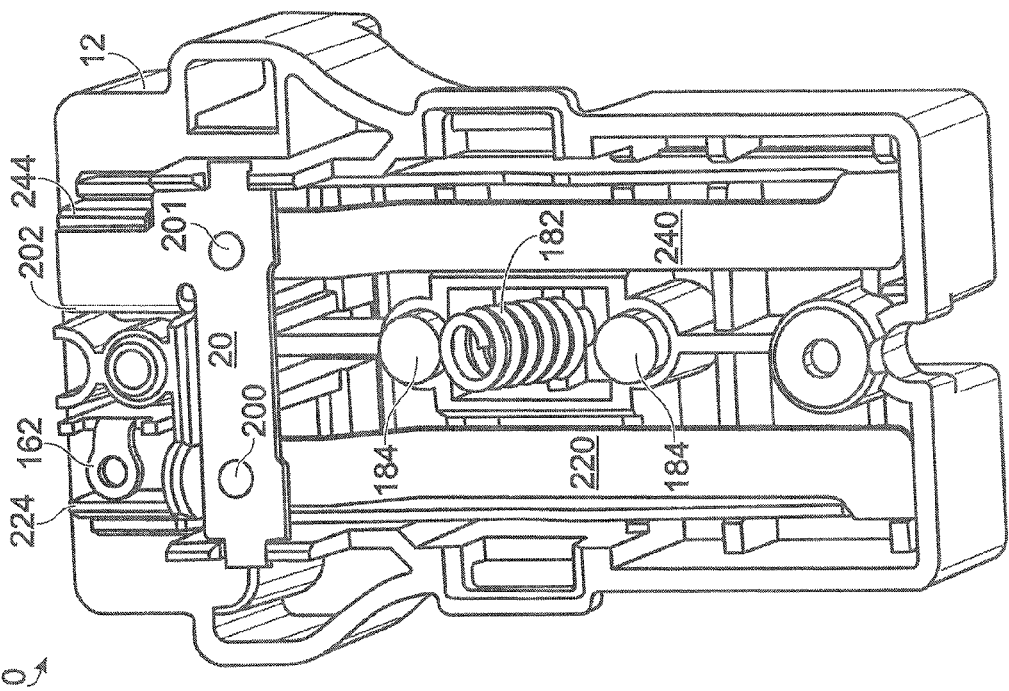
FIG. 5 is a perspective view of the toggle switch device shown in FIG. 2 with the front cover removed.

FIG. 5 is a perspective view of the toggle switch device shown in FIG. 2 with the front cover 14 and toggle switch 18 removed. Referring to the top of the page, the device contacts are arranged within receptacle 120 in the order of device traveler contact 224, device ground contact 162, common contact 202, and device traveler contact 244. Flex arms 220 and 240 are cantilevered leaf springs that are naturally biased upward such that contacts 222 and 242 are engaged with contacts 200 and 201 respectively. The toggle switch 18 position (in this view) is either up or down, such that only one contact pair is closed at a time in the manner previously described. Actuator spring 182 is coupled between actuator 18 and a raised portion of the interior wall of back body 12. Spring 182 is shown as being disposed between pad elements 184. When the toggle switch actuator 18 is snapped into position by spring 182, the pads 184 on either side absorb the energy and prolong the life of the toggle switch actuator 18.

Figure 6:
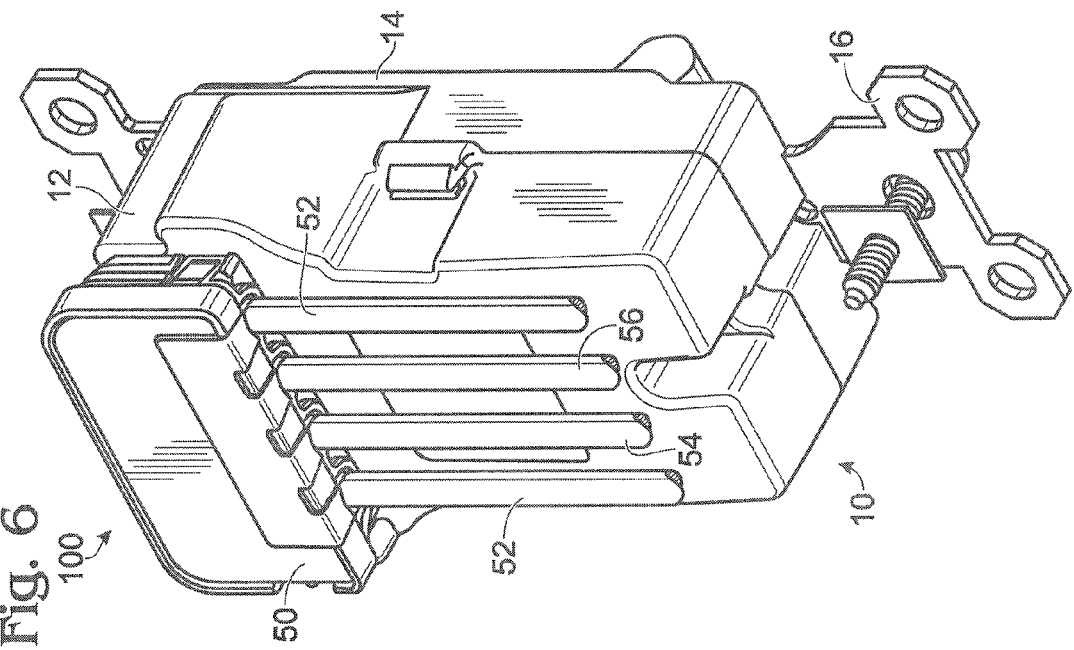
FIG. 6 is a perspective view of an electrical wiring system of the present invention featuring the toggle switch depicted in FIG. 2.

Referring to FIG. 6, a perspective view of an electrical wiring system 100 of the present invention is disclosed. As shown, the connector device 50 is fully inserted into the rear receptacle 120. The connector device 50 terminates AC power wires from the AC branch circuit. This embodiment is fully consistent with the example provided in FIG. 1. Connector device 50 terminates two traveler conductors 52, common conductor 54 and ground conductor 56.

FIG. 7 is a perspective view of a rear portion of the connector device 50 shown in FIG. 6. Connector device 50 includes a front cover 500 which is mated to a back body 510. The back body 510 includes a contact housing portion 511 which, as its name indicates, houses the connector contacts. The contact housing portion 511 includes access slots (502, 504, 506, 502) which provide access to connector traveler contact 520, connector common contact 540, connector ground contact 560, and the second connector traveler contact 520, respectively. A flexible male latch member 512 is integrally formed into the housing portion 511 and mates with the female latch mechanism 1200 in device receptacle 120 (FIG. 3).

FIG. 8 is a perspective view of a front portion of the plug device depicted in FIG. 6. In this view, the front cover is a planar member which includes indicia that identifies each of the wires terminated by connector device 50. Note that flexible latch member includes a latching tab 5120 that is configured to prevent connector 50 from being pulled out of the receptacle 120. The flexible latch mechanism 512 may be depressed by a user with only one hand when removing the connector 50 from the device 10. Had the flexible part of the mechanism been located on the wiring device, two hands would have been required to disengage the latch. Note also that the latch mechanism 512 is located away from the contacts on the back of the connector, and therefore, do not interfere with the blade openings. The latching mechanism (1200, 512) is configured to withstand a 20 pound pulling force applied for a predetermined period of time such as a minute.

Referring to FIG. 9, an exploded view of a the connector device 50 depicted in FIG. 7 is shown. Back body 510 includes wiring egress ports 501 that are configured to accommodate the conductors (502, 504, 506, 502). The contact housing portion 511 of the back body 510 is divided into four electrically insulated compartments. A compartment 513 is disposed at either end and they accommodate connector traveler contacts 502, which are shown as terminating traveler wires 52. Internal common compartment 514 accommodates connector common contact 540, which terminates common conductor 54. Finally, ground compartment 516 accommodates connector ground contact 560, which terminates ground conductor 56. This design ensures that the connector contacts are substantially in parallel with each other and easily mate with the plurality of device contacts disposed in receptacle 120. Once the contacts are snapped into their respective compartments, the cover member 500 is snapped in place to complete the assembly.

Note that connector device 50 is configured as a "right angled connector." The term right angle refers to the fact that the conductors and the contacts form a right angle relative to each other. One advantage of the right angle connector device 50 is that when the connector is inserted into receptacle 120 as shown in FIG. 6, the distance from the rear surface of the ground strap 16 to the front cover 500 is less than 1.375 inches. While the right angle plug is considered desirable in certain circumstances, the present invention may be employed with a straight connector device (See FIG. 27).

Figure 10:
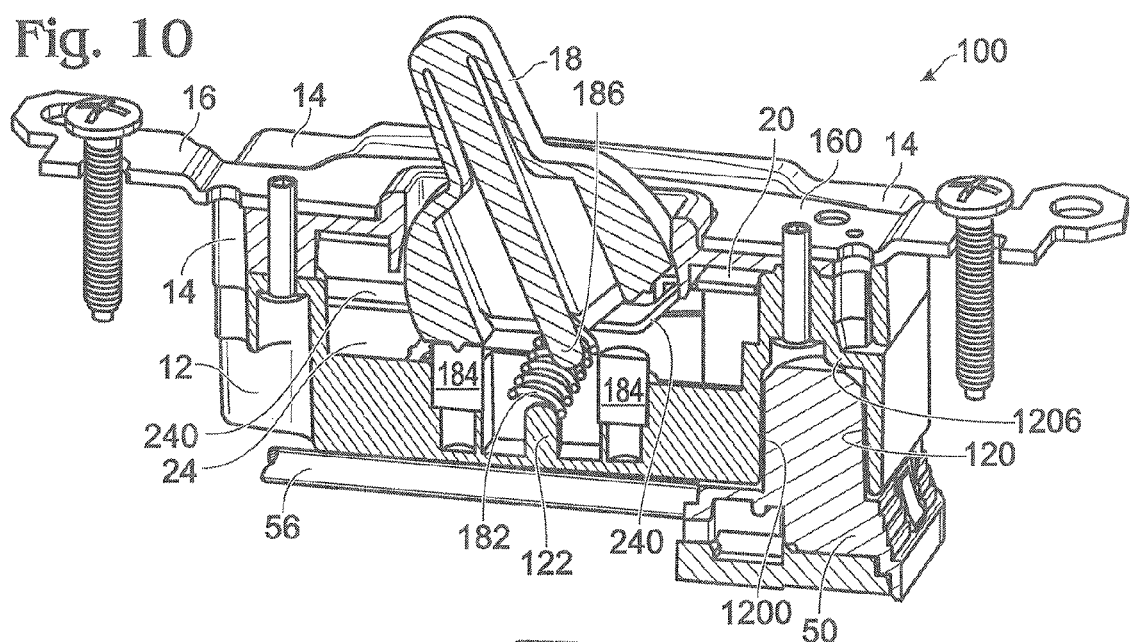
FIG. 10 is a longitudinal cross-section of the system depicted in FIG. 6.

Referring to FIG. 10, a longitudinal cross-section of the system 100 depicted in FIG. 6 is shown. The connector device 50 is fully inserted and latched into receptacle 120. The "nose" of the connector 50 does not abut the strap 16. Receptacle floor 1206 is disposed between the strap 16 and the device contact blades to prevent the blades from shorting out to the strap. In an alternate embodiment, the floor 1206 may be omitted if the strap has one or two side rails instead of being straight-through. The view provided by FIG. 10 clearly shows spring 182 being disposed between toggle actuator tab 186 and back body element 122. Traveler member 24 as well as its flex arm 240 are clearly shown behind toggle switch actuator 18.

Figure 11:
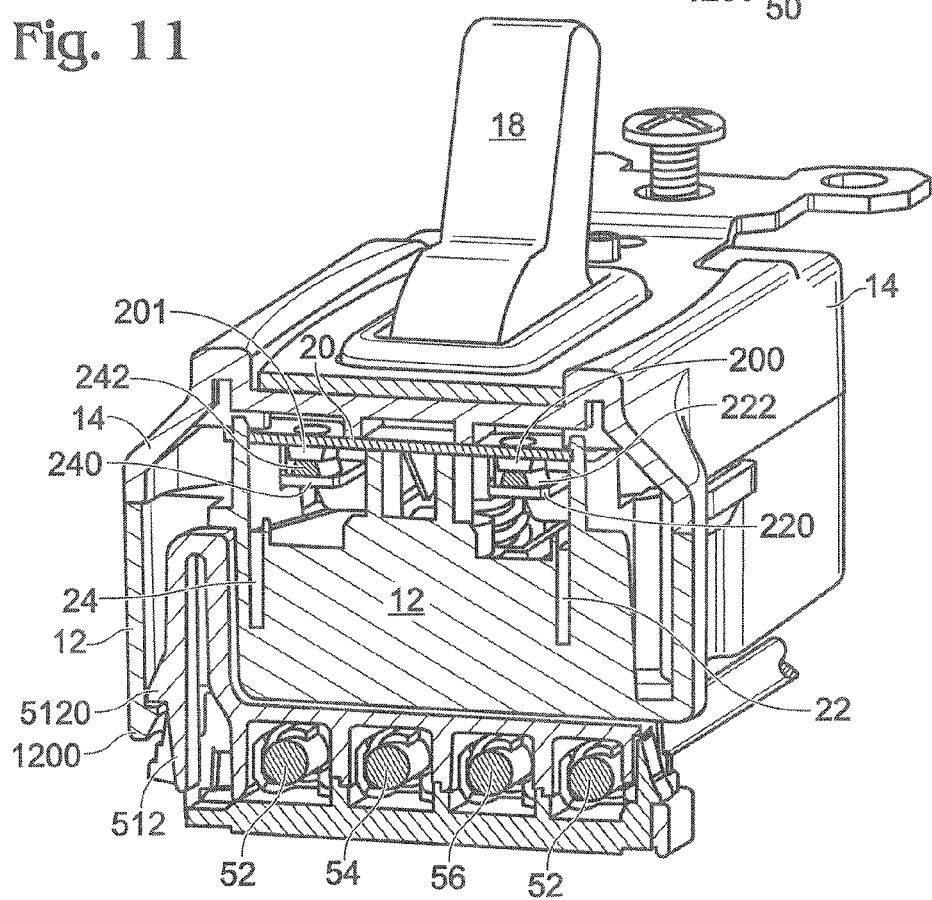
FIG. 11 is a latitudinal cross-section of the system depicted in FIG. 6 at an intermediate portion thereof.

Referring to FIG. 11, a latitudinal cross-section of the system 100 depicted in FIG. 6 at an intermediate portion of device 10 where the wires (52, 54, 56, 52) enter connector 50. In this toggle switch position, the fixed contact 200 and movable contact 222 are closed and fixed contact 201 and movable contact 242 are open. This view also shows the operation of the latching mechanism quite clearly. Latching tab 5120 disposed on flexible latch member 512 is engaged by a lip formed in the female latch member 1200.

Figure 12:
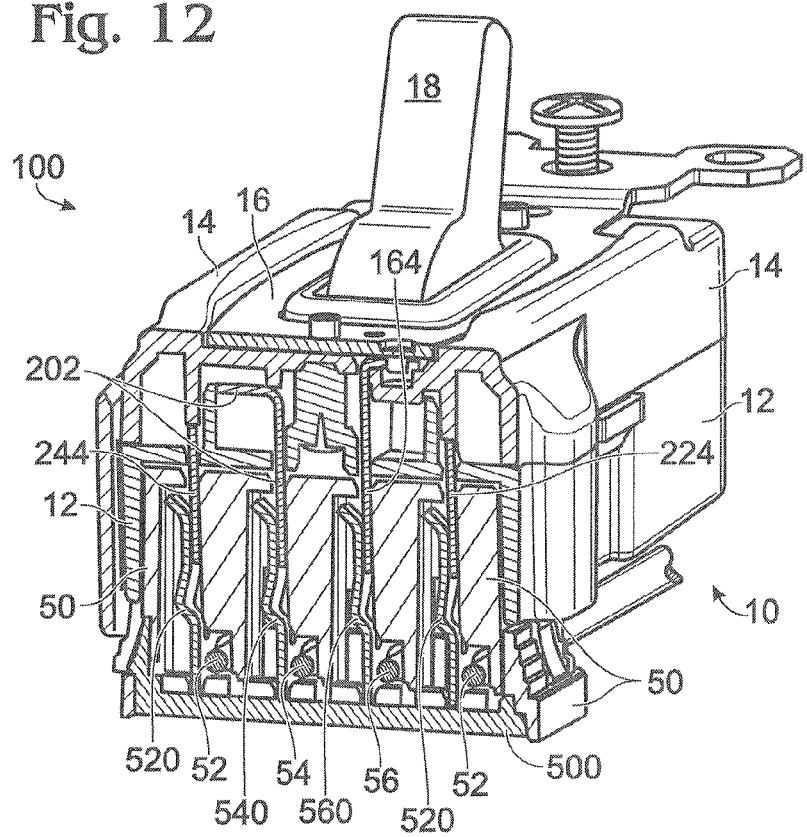
FIG. 12 is a latitudinal cross-section of the system depicted in FIG. 6 at an end thereof.

FIG. 12 is a latitudinal cross-section of the system depicted in FIG. 6 at an end of the device 10. From left to right, the traveler device contact 244 extends downwardly from the floor of the receptacle 120 and is engaged by the traveler connector contact 520 coupled to traveler wire 52. Device common contact 202 extends from the stationary common member 20 into the receptacle 120 and is engaged by common connector contact 540, which in turn, is connected to common wire 54. Device ground contact 164 extends from the ground strap 16 and is engaged by connector ground contact 560. Of course, the connector ground contact 560 is connected to ground wire 56. Finally, at the right end of the drawing, the second device traveler contact 224 is engaged by the second connector traveler contact 520, which is connected to the second traveler wire 52.

Figure 13:
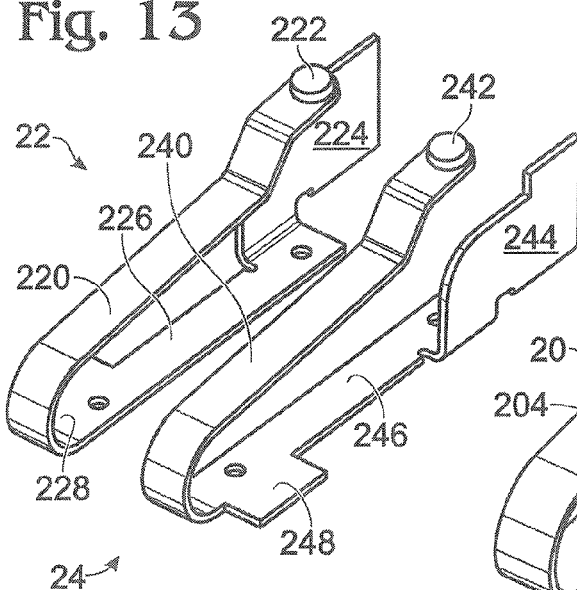
FIG. 13 is a perspective view of an alternative traveler contact structure.

Referring to FIG. 13, a perspective view of an alternative traveler contact structure in accordance with alternate embodiment of the present invention is disclosed. In this embodiment, the side rails of structure 22 and 24 previously disclosed are replaced by base portions 226 and 246, respectively. This structure may be advantageous during fabrication because it has fewer complex bends. Structures 22 and 24 may be fabricated by stamping out a single strip of conductive material having a winged device blade (224, 244) at one end and the flex arm (220, 240) at the other. Subsequently, the flex arm (220, 240) is folded over the rectangular portion (228, 248) in the manner depicted to complete the fabrication of the part.

Figure 14:
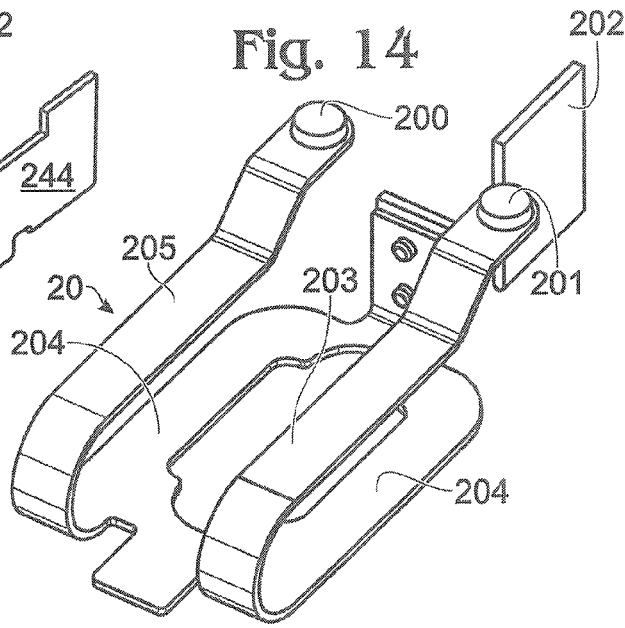
FIG. 14 is a perspective view of an alternative common member contact structure.

Referring to FIG. 14, a perspective view of an alternative common member contact structure 20 in accordance with yet another alternate embodiment of the present invention is disclosed. In this embodiment, the traveler contact structures (22, 24) are fixed within device 10. Common structure 20 includes a base portion 204 which is configured to be seated within the back body 12 of device 10. Flex arms (203, 205) extend from one end portion of base 204 and include movable contacts 201 and 200, respectively. A device common contact 202 extends from the other end of the base portion 204.

As previously noted, the present invention applies to other types of switches. In one embodiment, one of the traveler structures (22 or 24) is omitted to create a single-pole single-throw switch. In another embodiment, the switching structure may be configured as two single pole switches. The common member 20 is split into two members each having a single stationary contact. Each of the common members has a device contact disposed in receptacle 120. The two cams on the toggle actuator are aligned so the movable contacts open and close together, or by replacing the single toggle switch 18 with two switch actuators.

Figure 15:
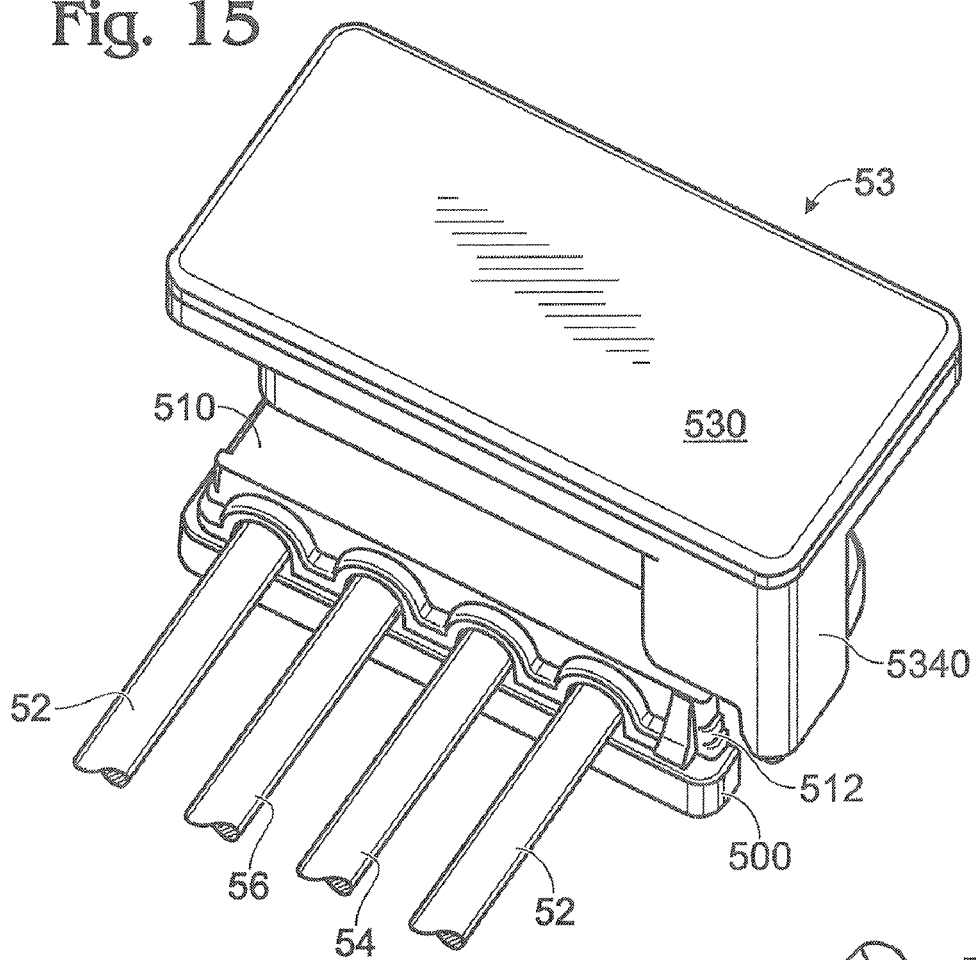
FIG. 15 is a perspective view of a pull switch device in accordance with another embodiment of the present invention.

As embodied herein and depicted in FIG. 15, a perspective view of a pull switch device 53 used in conjunction with connector device 50 is disclosed. A problem arises during the conventional rough-in phase of the installation after the connector 50 has terminated the AC branch wires (52, 54, 56, 52). While power may be available, it cannot be used because the switch device 10 has not been connected to the lighting device via connector 50 because other construction procedures such as sheet rocking, painting, etc. are being performed. Accordingly, when conventional devices are employed, the contractor must employ portable lighting fixtures during this phase at considerable expense. The pull switch 53 of the present invention remedies this issue by shorting together the two traveler contacts and the common contact. Viewed in conjunction with FIGS. 1A-1D, one of ordinary skill in the art will understand that shorting these contacts together in the connector device will permit the downstream load to be energized.

In FIG. 15, the pull switch 53 is plugged into the connector device 50. The pulls switch includes a front cover 530 and an insert body 534 (not shown) that includes a latch 5340 configured to engage connector latch mechanism 512 to secure the connection.

Figure 16:
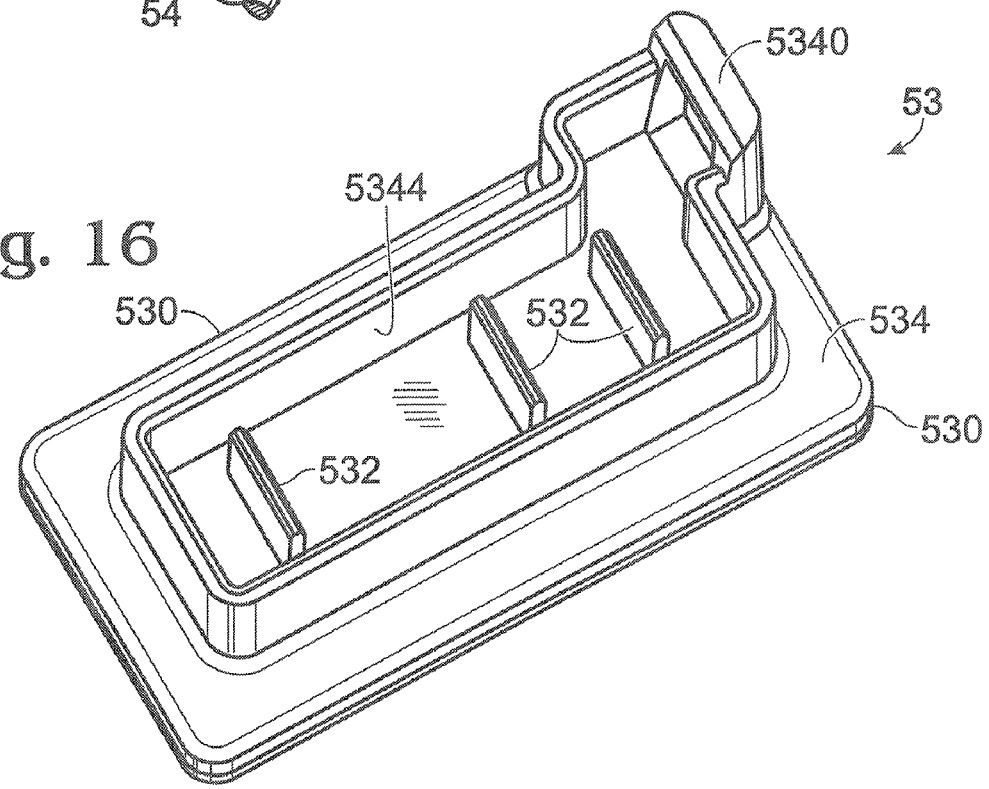
FIG. 16 is a perspective view of a rear portion of the pull switch depicted in FIG. 15.

FIG. 16 is a perspective view of a rear portion of the pull switch depicted in FIG. 15. In this view, internal contacts 532 are disposed within the lip portion 5344 of insert body 534. The internal view of latch member 5340 may also be seen. It includes a hollow lip that is configured to engage the flexible latch 512 of connector device 50.

Figure 17:
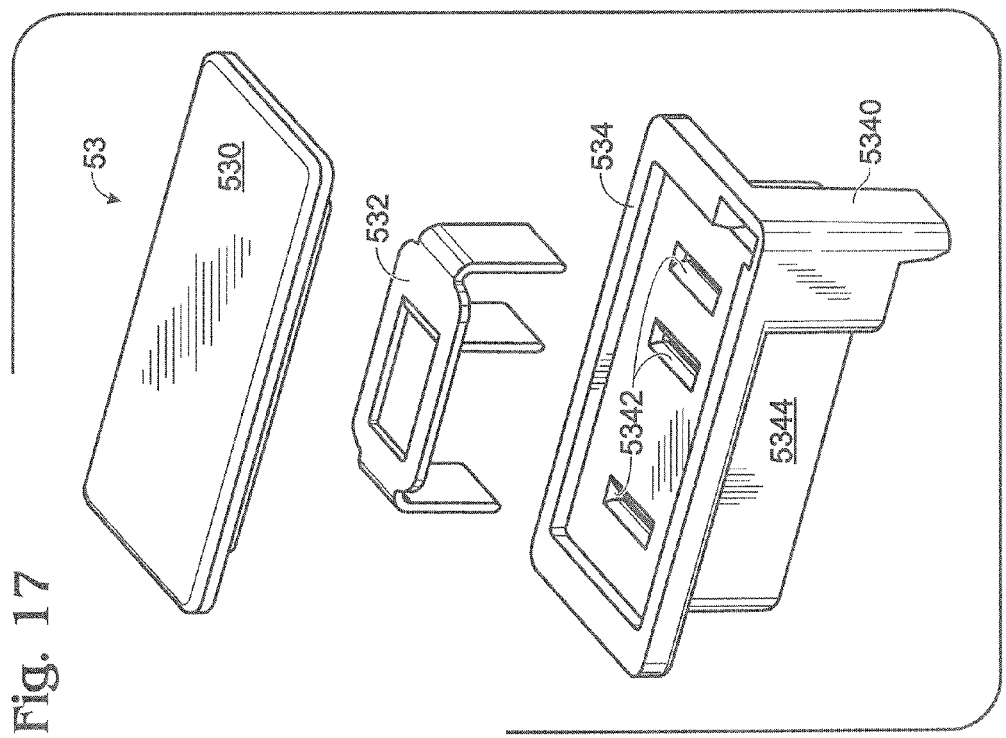
FIG. 17 is an exploded view of the pull switch depicted in FIG. 15.

FIG. 17 is an exploded view of the pull switch depicted in FIG. 15. The contact structure 532 is shown as an integral piece of conductive material that includes three contacts extending therefrom. The three contacts are inserted into the slots 5342 formed in insert member 534 such that they enclosed within lip member 5344. Finally, the cover portion 530 is snapped over insert 534 to complete the pull switch assembly.

As embodied herein and depicted in FIG. 18, an exploded view of a rocker switch device 10 in accordance with an alternate embodiment of the present invention is disclosed. Switch device 10 includes a decorator paddle switch 18 that is disposed within aperture 140 of the cover member 14. The paddle switch 18 is coupled to a spring element 182. The spring element 182 is connected to a pivot contact member 185 which is seated within the cradle portion of common contact structure 20. The pivot member 185 extends through an opening 144 in the cover member 14 and through the central opening 164 formed in ground strap 16.

The ground strap 16 further includes a tab member 160 which extends inwardly into opening 164. The device ground contact 162 extends from tab member 160 into receptacle 120.

Figure 19:
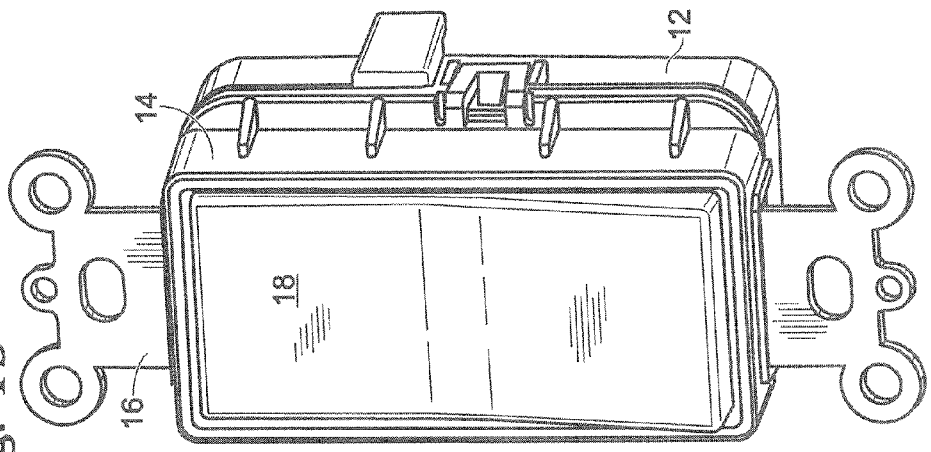
FIG. 19 is a perspective view of the rocker switch device depicted in FIG. 18.

The switch device 10 is configured as a three-way switch that includes traveler contact structure 22, common contact structure 20 and traveler contact structure 24. The common structure 20, as alluded to previously, includes an apertured cradle 208 which accommodates pivot contact 185. The common member also includes device common contact 202. Traveler contact structures 22 and 24 are disposed on either side of the common structure 20 and are mirror images of each other. Traveler structure 22 includes traveler contact 224 on one end thereof and a fixed contact 222 on the opposite end. The fixed contact 222 is disposed on the outboard side of the pivot member. The fixed contact 242 on traveler structure 24 is disposed on the inward side of the pivot contact 185. Of course, the pivot contact 185 is positioned by the paddle switch to engage either contact 222 or contact 242 by way of a double-sided contact. FIG. 19 is a perspective view of the fully assembled rocker switch device 10 depicted in FIG. 18.

Figure 20:
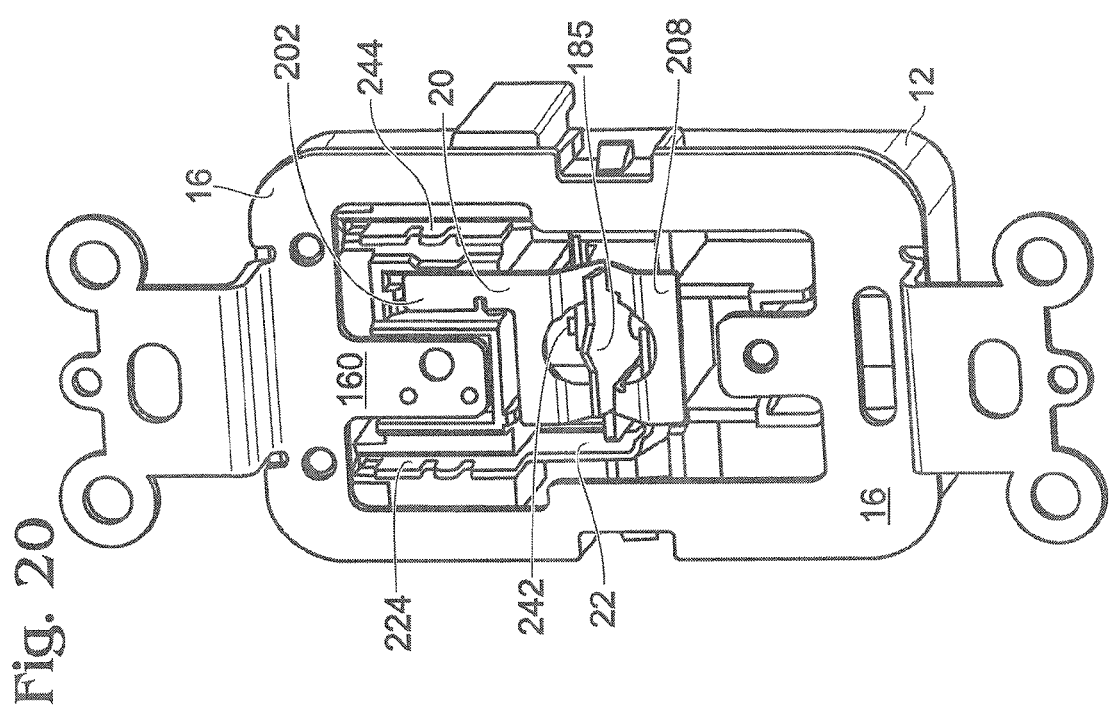
FIG. 20 is a perspective view of the rocker switch device depicted in FIG. 18 with the front cover portion removed.

Referring to FIG. 20, a perspective view of the rocker switch device 10 depicted in FIG. 18 is shown with the front cover portion 14 removed. In this view, the switch mechanism is framed by the central opening of the ground strap 16. Going from left to right and starting at the top left corner, the device contacts are aligned in a row within the receptacle 120 (disposed underneath device 10). Device traveler contact is leftmost, and disposed adjacent the ground contact 164 which is disposed underneath ground tab 160. The device common contact 202 is disposed between the ground contact 164 and the rightmost traveler contact 244. In the center of the device 10, the common contact structure 20 is shown with the pivot contact 185 disposed therein. The pivot contact is rotated in the upward direction to engage traveler contact 222 which is disposed under the common contact structure 20 and is therefore not visible.

Figure 21:
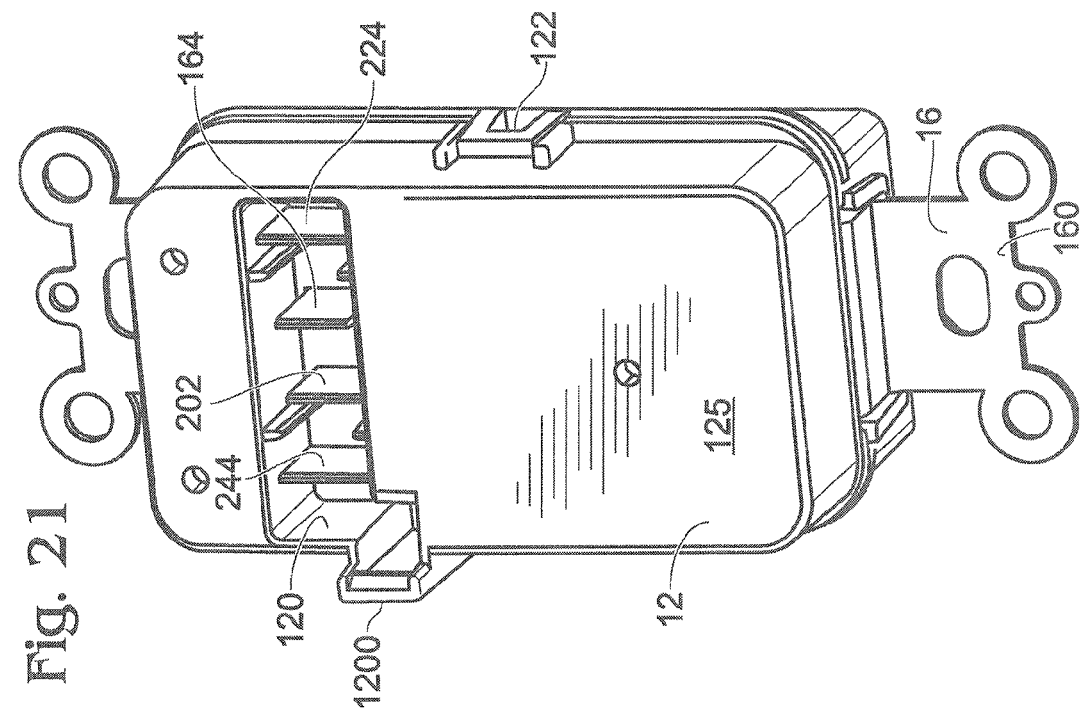
FIG. 21 is a perspective view of a back portion of the rocker switch device depicted in FIG. 18.

Referring to FIG. 21, a perspective view of a back portion of the rocker switch device 10 depicted in FIG. 18 is shown. The receptacle 120 is positioned between the back body centroid and the upper end (in this view) of the back body 12. As before, the device blade contacts (244, 202, 164, 224) are arranged in row and parallel with each other. As noted before, the device contacts within the connector arrangement 120 may be implemented using any suitable geometry and may be recessed within a receptacle or disposed in a plane above the rear major surface 125 of the back body 12. This embodiment also includes female latch mechanism 1200 which is similarly to the one previously described.

Figure 22:
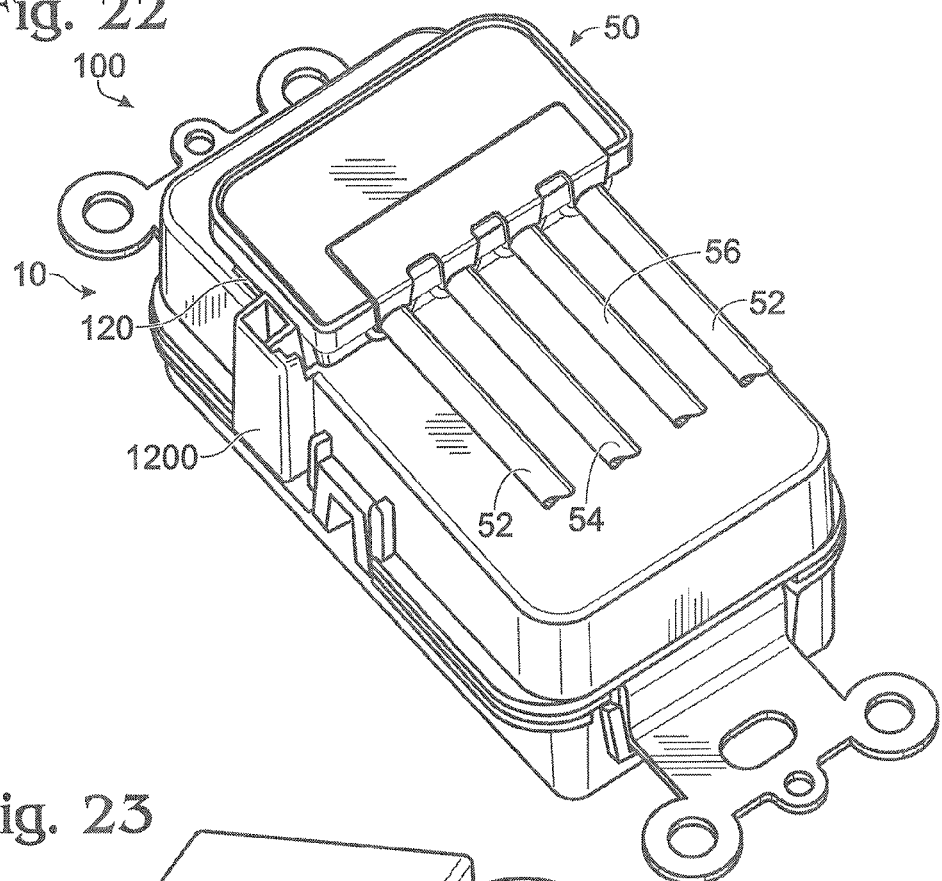
FIG. 22 is a perspective view of an electrical wiring system of the present invention featuring the rocker switch depicted in FIG. 18.

FIG. 22 is a perspective view of an electrical wiring system 100 of the present invention featuring the rocker switch depicted in FIG. 18. In this view, the connector device 50 is inserted and latched within receptacle 120 of device 10.

Figure 23:
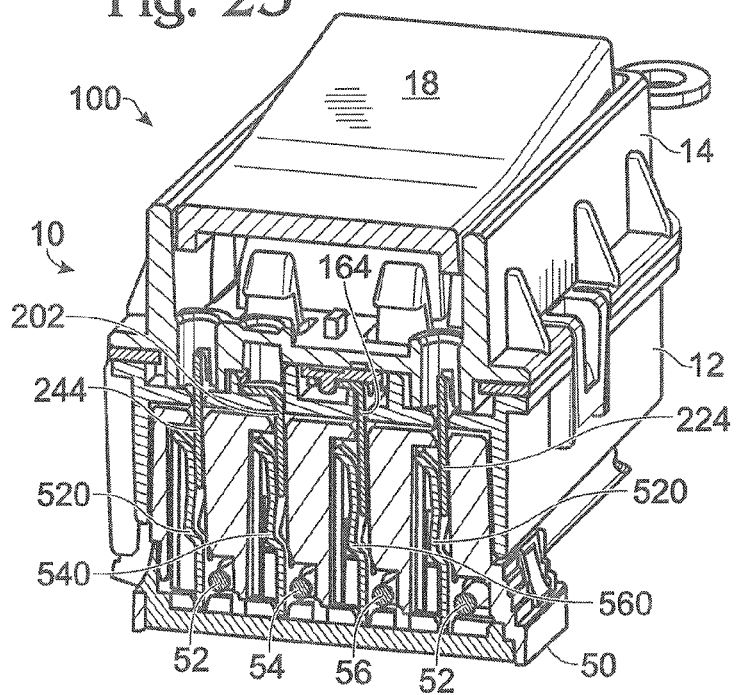
FIG. 23 is a latitudinal cross-section of the system depicted in FIG. 22 at a first end thereof.

Referring to FIG. 23, a latitudinal cross-section of the system depicted in FIG. 22 is disclosed. From left to right, the traveler device contact 244 extends downwardly from the floor of the receptacle 120 and is engaged by the traveler connector contact 520 coupled to traveler wire 52. Device common contact 202 extends from the stationary common member 20 into the receptacle 120 and is engaged by common connector contact 540, which in turn, is connected to common wire 54. Device ground contact 164 extends from the ground strap 16 and is engaged by connector ground contact 560. Of course, the connector ground contact 560 is connected to ground wire 56. Finally, at the right end of the drawing, the second device traveler contact 224 is engaged by the second connector traveler contact 520, which is connected to the second traveler wire 52.

Figure 24:
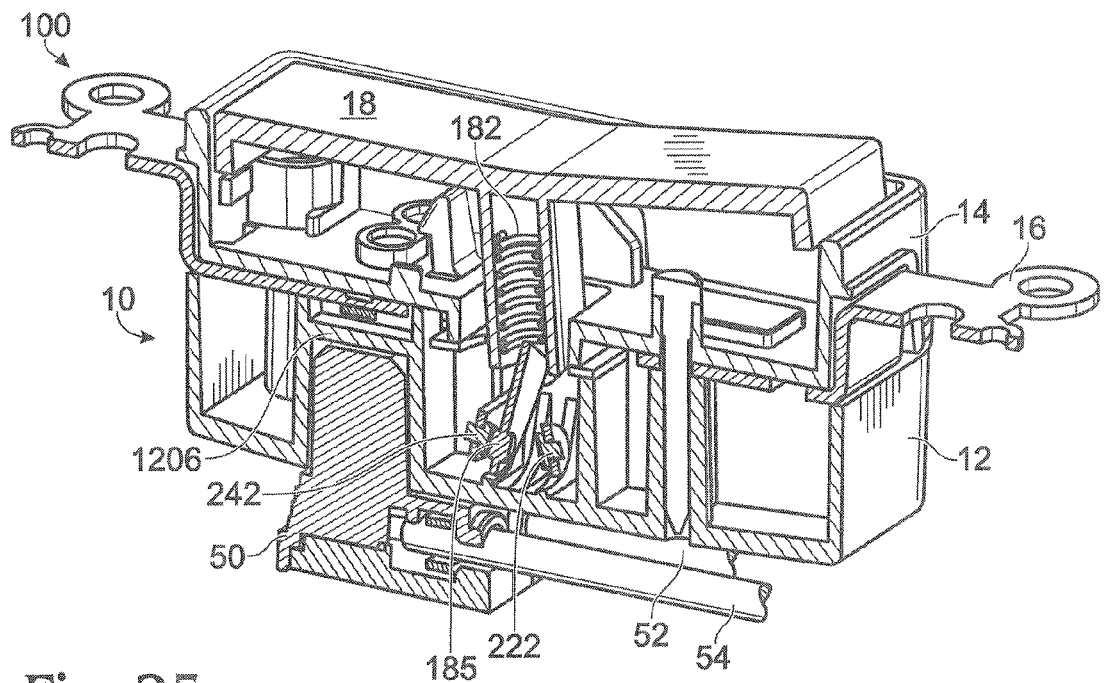
FIG. 24 is a longitudinal cross-section of the system depicted in FIG. 22.

Referring to FIG. 24, a longitudinal cross-section of the system depicted in FIG. 22 is disclosed. Again, the connector device 50 is fully inserted and latched into receptacle 120. The "nose" of the connector 50 does not abut the strap 16. Receptacle floor 1206 is disposed between the strap 16 and the device contact blades to prevent the blades from shorting out to the strap. In an alternate embodiment, the floor 1206 may be omitted if the strap has one or two side rails instead of being straight-through. The view provided by FIG. 10 clearly shows spring 182 being disposed between paddle switch 18 and pivot contact 185 which is engaged with traveler contact 242.

Figure 25:
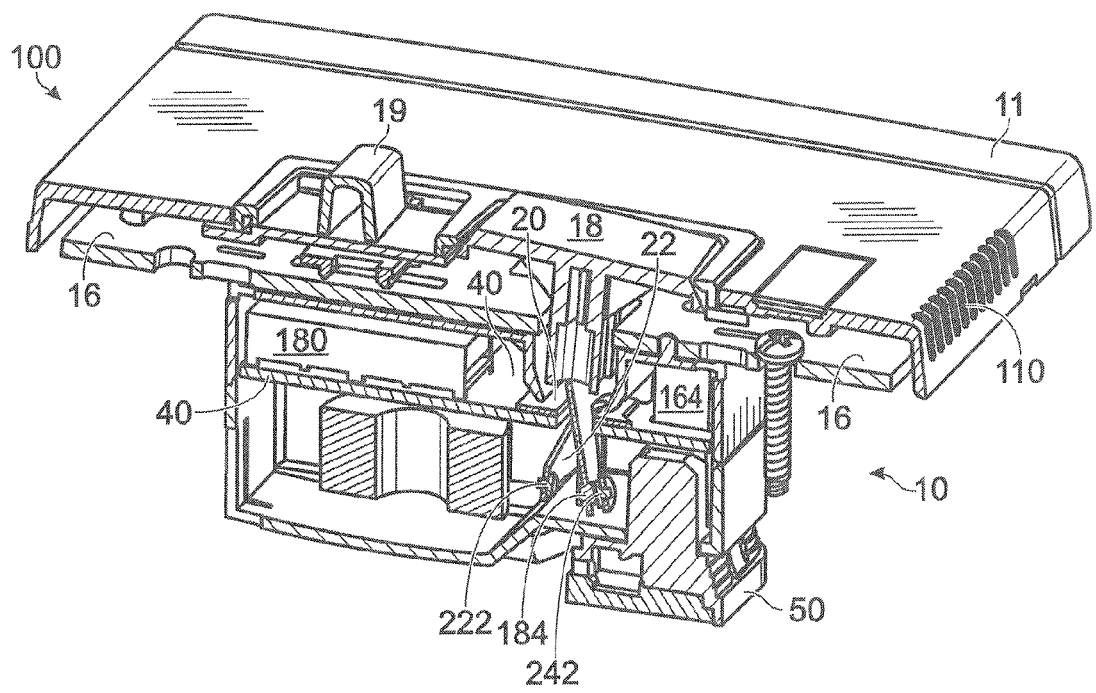
FIG. 25 is a longitudinal cross-section view of a dimmer switch device in accordance with another alternate embodiment of the present invention.

As embodied herein and depicted in FIG. 25, a longitudinal cross-section view of a dimmer switch device 10 in accordance with another alternate embodiment of the present invention is disclosed. In this embodiment, a cover plate 11 is disposed over a heat sink/ground plate 16. The cover plate includes vents 110 disposed at either end thereof. A preset switch 18 and a dimmer control 19 are disposed within a central aperture of the cover plate 11. The dimmer control is coupled to a dimmer control circuit 180 disposed on printed circuit board 40. The preset switch 18 is a three-way switch. The pivot contact 185 is shown as being engaged with traveler contact 242 and not engaged with traveler contact 222. Reference is made to U.S. patent application Ser. No. 11/343,102, now U.S. Pat. No. 7,497,582, which is incorporated herein by reference as though fully set forth in its entirety, for a more detailed explanation of a dimmer switch.

Figure 26:
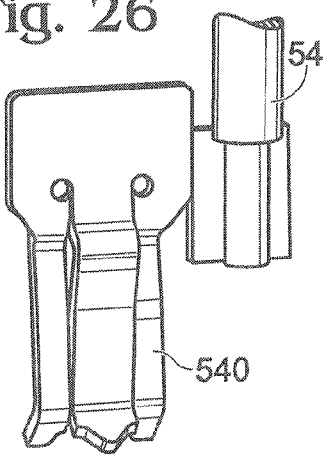
FIG. 26 is perspective view of a plug device contact for the plug device depicted in FIG. 12.

Referring to FIG. 26, a perspective view of a connector device contact for an alternative embodiment of connector device depicted in FIG. 9. As noted previously, the connector device shown in FIG. 9 and elsewhere in this disclosure is directed to a right angle connector. The contact 540 shown in FIG. 26 is for a straight, or 180° connector whereby the common wire 54, for example, is essentially perpendicular to the rear major surface of the back body 12 when the connector 50 is inserted and latched into the receptacle 120 in accordance with the teachings of the present invention.

Figure 27A:
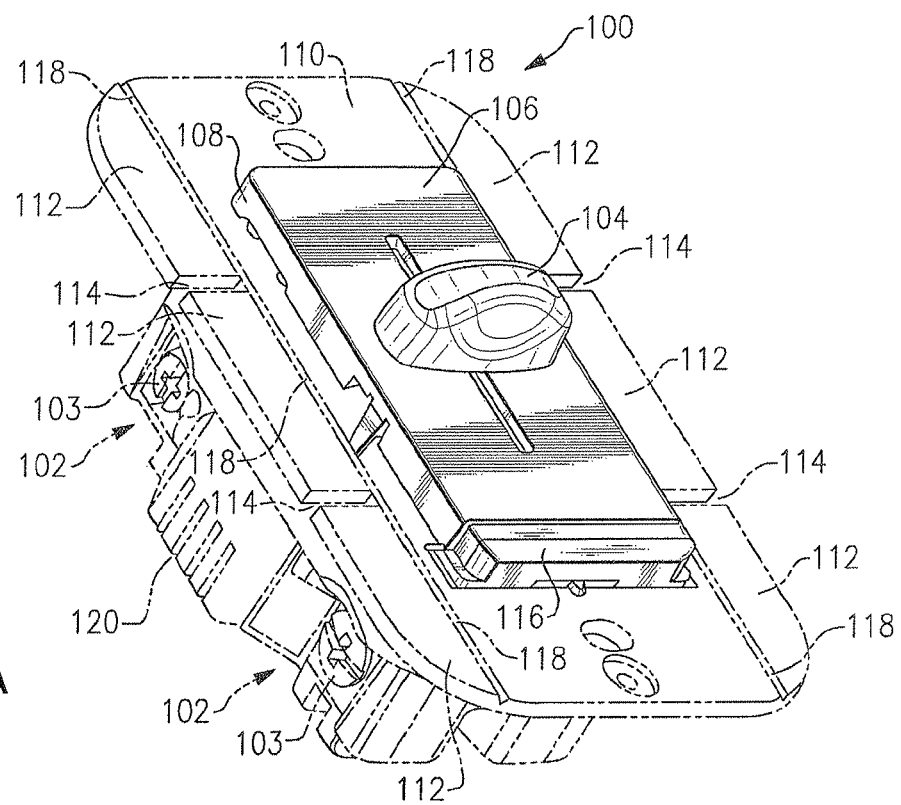
FIG. 27A is a perspective view of a power control device in accordance with a first embodiment of the present invention.

As embodied herein and depicted in FIG. 27A, a perspective view of a first embodiment of the power control device is shown. Device 100 includes a mounting strap 110, which functions as the device heat sink, coupled between a user accessible front cover portion 106 and device body member 120. A light module 116 is disposed between cover member 106 and an end portion of front cover portion 106. Device 100 includes screw terminals 102 which are provided to connect device 100 to both the voltage source and the load. A control knob 104 is disposed on the user accessible cover member 106 and is employed to adjust the power delivered to the load.

Power control device 100 may include a light module 116. Light module 116 may be configured to emit light when the control knob 104 is in the full OFF position. In this embodiment, lamp 116 operates as a locator for power control device 100 such that device 100 may be located by a user in a darkened room. In an alternate embodiment, lamp 116 serves as a pilot light, emitting light when power control device 100 is not in the fully OFF position. A pilot light allows the user to identify the power control device that is in use. Lamp module 116 includes a circuit that results in a steady light emission or, alternatively, that results in a blinking light emission, occurring during an intended circumstance for light emission such as has been described. In another embodiment of the present invention, lamp 116 is a removable lamp module.

In yet another embodiment, the removable lamp module may be replaced by a blank member. The blank member allows the power control device 100 to be reconfigurable from an illuminated device to a non-illuminated device, and vice-versa, in accordance with the user's requirements.

Figure 27B:
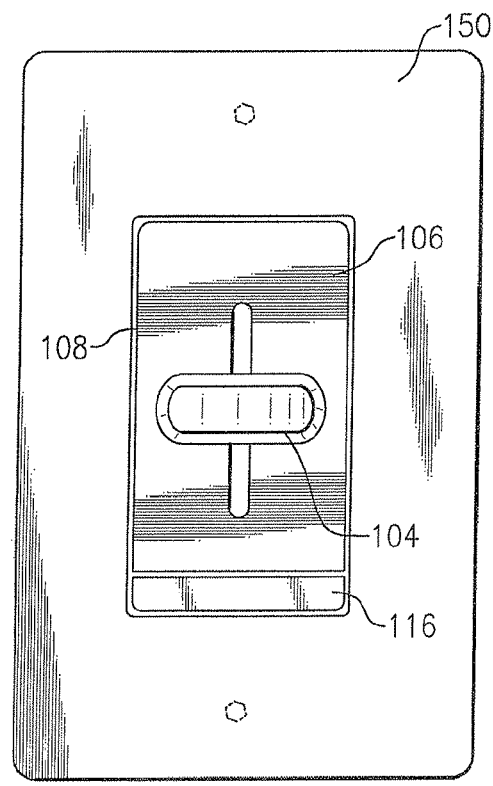
FIG. 27B is a plan view of the power control device depicted in FIG. 27A disposed in a standard wall plate.

FIG. 27B is a plan view of the power control device depicted in FIG. 27A disposed in a standard wall plate 150. In particular, the frameless front cover member 106 has a raised rectangular form factor, as evidenced by raised edge 108, which substantially corresponds to the standard wall plate opening and extends therethrough. The transverse dimension of frameless front cover member 106 is substantially equal to the transverse dimension of the standard wall plate opening. The gap between wall plate 150 and cover member 106 is slightly exaggerated in FIG. 27B. The planar surface of member 106 is approximately flush with the exposed surface of the wall plate. Accordingly, the cover plate cannot interfere with actuation of control knob 104. Furthermore, there are no inaccessible crevices or recessed surfaces that inhibit cleaning. The term "standard wall plate" is defined herein as a wall plate that conforms to the dimensions provided by the ANSI/NEMA WD6 standard.

Figure 28:
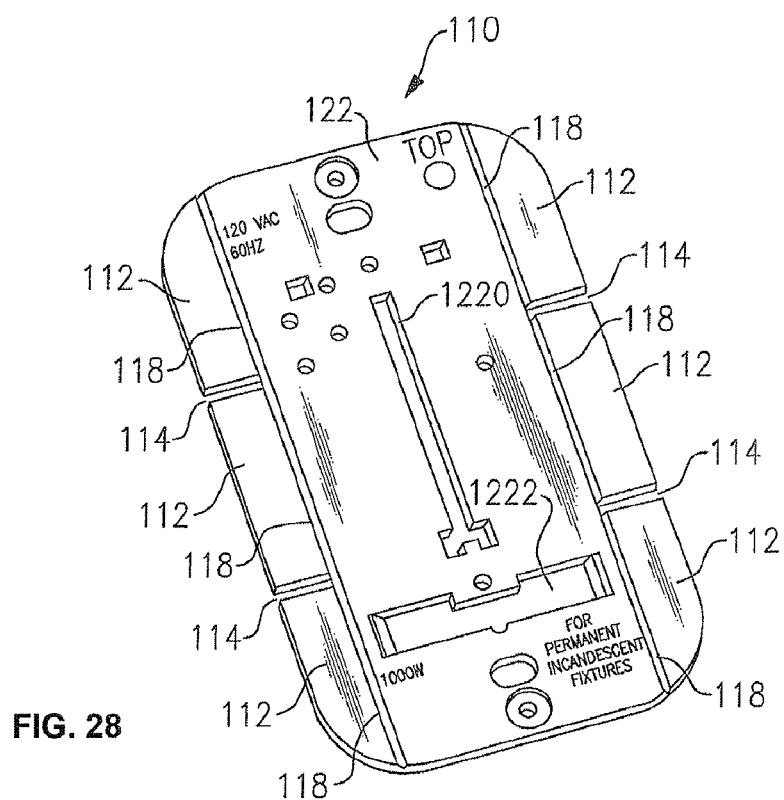
FIG. 28 is a top view of a heat sink mounting strap depicted in FIG. 27A.

Referring to FIG. 28, a top view of a heat sink mounting strap 110 depicted in FIG. 27A is shown. Heat sink 110 is planar, avoiding the disadvantages associated with certain conventional heat sinks. Heat sink 110 includes a plurality of removable tab members 112 connected to a central heat sink portion 122. Central portion 122 includes a control knob aperture 1220 and a lamp assembly aperture 1222. An upset line 118 extends along each longitudinal side of heat sink 110 separating interior portion 122 from removable tabs 112. Upsets 118 may be implemented using scored lines, perforations, notches, and/or similar features. Tabs 112 are segmented by forming linear gaps 114 extending between the longitudinal edges of the heat sink and upset lines 118. Because the arrangement does not include any longitudinal gaps between central portion 122 and tabs 112, thermal conductivity is only marginally impacted. At the same time, the design allows the tabs 112 to be easily removed when tab removal is a necessity. Of course, those of ordinary skill in the art will understand that the heat generated by solid state devices, such as a triac, is more readily dissipated if the tabs 112 are not removed.

The conventional heat sink shown in FIG. 2 of U.S. Pat. No. 7,497,582 is non-planar and is characterized by a thickness that is approximately equal to 0.062 inches. Those of ordinary skill in the art understand that thermal conductivity is a function of both the cross-sectional thickness of the heat sink, as well as the material used to implement the heat sink. Thinner heat sinks may result in hot spots during operation that must be isolated from device components. The depth of the conventional device from the heat sink to a major rear surface of the device is typically greater than 1.40 inches to provide the necessary isolation. On the other hand, the heat sink 110 of the present invention has a thickness within an approximate range between 0.080 and 0.10 inches. The combination of the increased cross-sectional area, i.e., thickness, the planar heat sink configuration, and the increased planar surface area provided by the tab 112 arrangement, contributes to a heat sink that exhibits a surface temperature that is more evenly distributed and peak temperatures that are less severe. Accordingly, the air space required to thermally isolate device components may be reduced. Also, the planar heat sink of the present invention does not have a downwardly stepped interior portion. This translates to a reduction in the distance required between the heat sink 110 and the interior rear surface of the housing 120 to approximately 1.20 inches.

Figure 29:
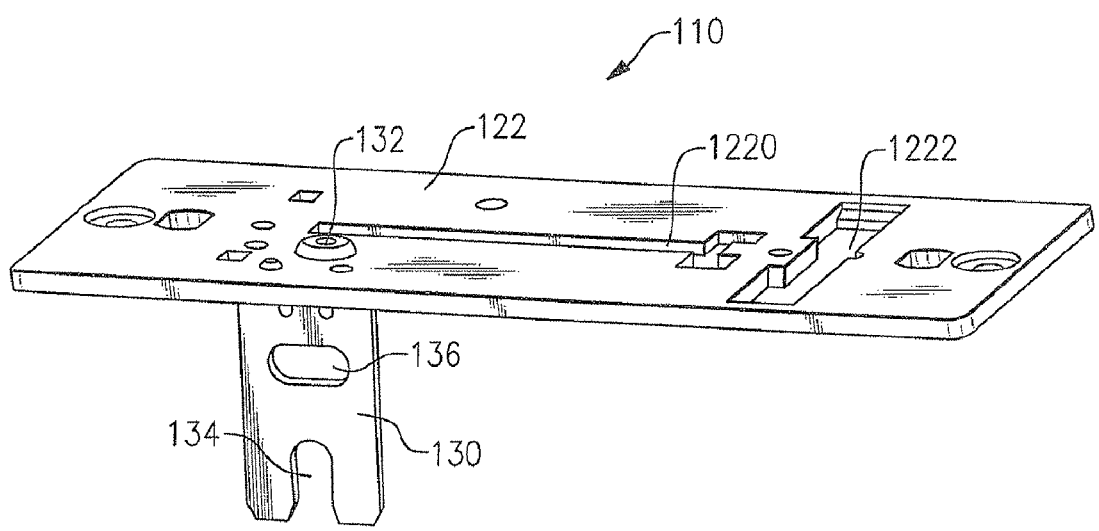
FIG. 29 is a side perspective view of the heat sink assembly depicted in FIG. 28.

Referring to FIG. 29, a side perspective view of the heat sink assembly 110 depicted in FIG. 28 is shown. In this view, tabs 112 are shown as being removed for clarity of illustration. Heat sink assembly 110 includes a ground tab 130 connected to the planar heat sink 122 by a rivet 132. Ground tab 130 includes a terminal region 134 configured to accommodate a ground screw. As noted previously, limitations associated with conventional devices often result in the ground terminal connection becoming excessively hot. Ground tab 130 addresses the drawbacks associated with the conventional designs in several ways.

As noted above, in some conventional designs, a section of an end portion 28 is bent downwardly to form a screw terminal. The drawback associated with this approach relates to the fact that a tab 22 must be removed. Consequently the over-all surface area used for device cooling is reduced. The inclusion of ground tab 130 in the present invention eliminates this drawback. The two-piece-construction of ground tab 130 also eliminates the amount of heat transmitted to the ground terminal by reducing the thermal conductivity of the ground tab 130 relative to the heat sink 122 itself.

Ground tab 130 may have a lower thermal conductivity by reducing the cross-sectional area of the ground tab. Thus, while the material employed to fabricate heat sink 122 and ground tab 130 may have identical, or similar, heat conduction properties, the reduction in cross-sectional area will result in lower thermal conductivity. The cross-sectional area may also be reduced by the inclusion of slot 136 in ground tab 130. On the other hand, a similar result may be obtained by selecting a ground tab material that has a comparatively greater thermal resistivity than the heat sink material. The use of dissimilar materials will also prevent excessive thermal energy from being conducted to the ground wire. In one embodiment, ground tab 130 is made out of steel whereas heat sink 122 is made out of aluminum. Accordingly, the heat sink 122 may operate at a maximum temperature of approximately 80° C., whereas the ground tab's thermal resistance limits the ground terminal temperature to about 60° C. This arrangement prevents the temperature applied to the ground wire insulation from exceeding a safe level.

Those of ordinary skill in the art will understand that heat sink 122 may be connected to ground tab 130 by any suitable means including, but not limited to, welding, braising, soldering, gluing, interference fitting, and press-fitting.

Figure 30:
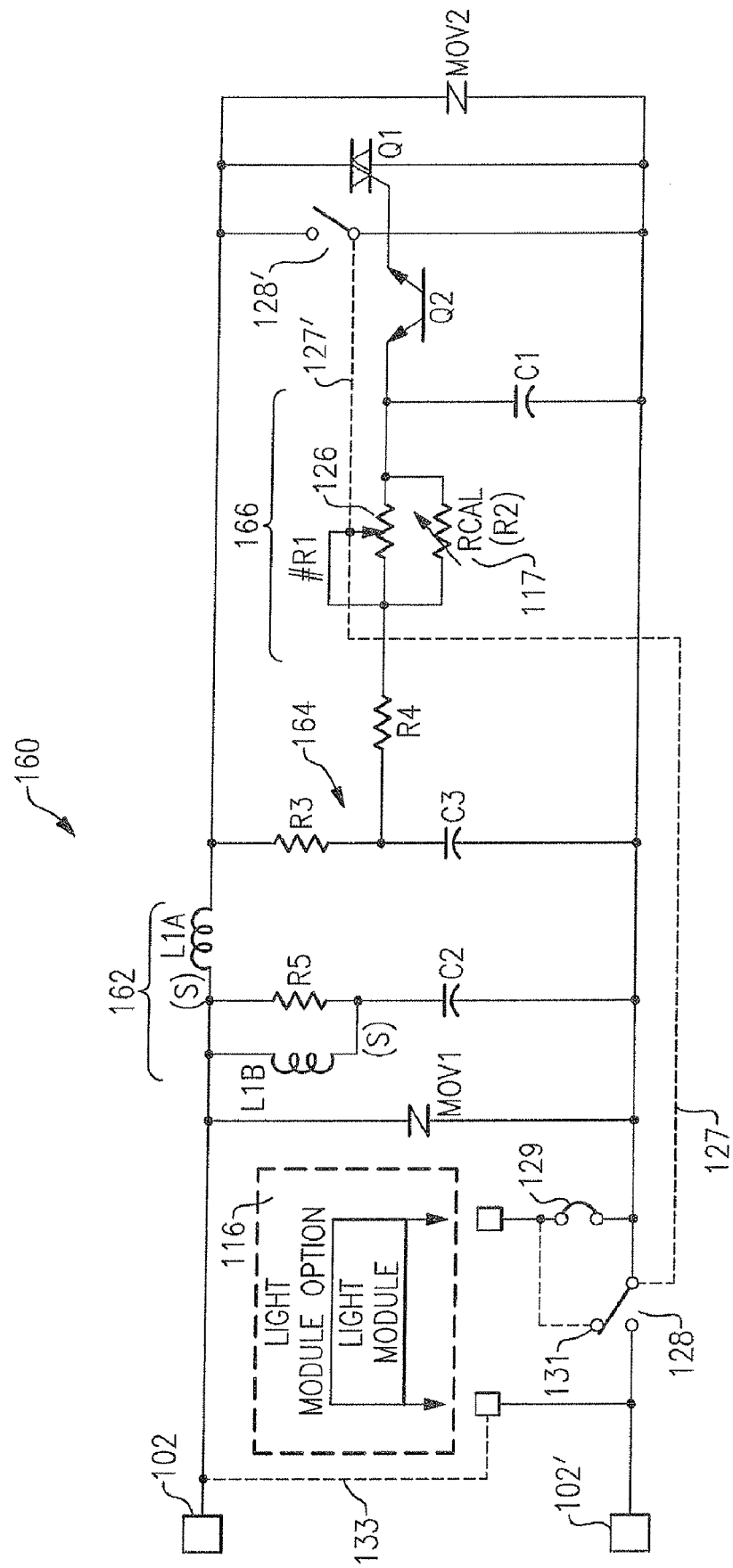
FIG. 30 is a schematic diagram of the power control device shown in FIG. 27A.

As embodied herein and depicted in FIG. 30, a schematic diagram for the power control device depicted in FIG. 27A is shown. The device is connected to the electrical distribution system by connecting the load between the hot line and terminal 102. Terminal 102' is connected to the return line. Light module 116 is configured to visibly display an operative condition of the power control device. As is shown by way of example in FIG. 27A, lamp module 116 is connected in series with terminal 102'. Lamp module 116 is disposed in series with the series pass element 161 and in parallel with control switch 128. Control switch 128 is operatively coupled to adjustable element R1. The coupling is denoted by dotted line 127. Of course, light module 116 is OFF when switch 128 is in the closed position and ON when switch 128 is in the open position. Control switch 128 is configured to close when adjustable element R1 is adjusted for maximum (or near maximum) current through series pass element Q1. This type of switch is known as a "full-on switch" or "full-on bypass switch." A purpose of the full-on switch is to operate the light module as a nightlight as will be explained.

In an alternate embodiment control switch 128 is configured to open when the reset element is adjusted for minimum (or near minimum) current through series pass element Q1. This type of switch is known as an air gap switch or a slide-to-off switch. An air gap switch ensures that there is little or no electrical current to the load that could shock someone when they are changing a light included in the load. Preferably this current level is less than 0.5 mA. This current level is too low to activate the load. The term "control switch" as used herein, is a switch that is disposed in series with the power control load that operates in response to the adjustment of the variable control mechanism.

Contact 131 of control switch 128 can be omitted to simplify or reduce the cost of assembly by employing jumper 129. Jumper 129 may be implemented using any suitable means, such as a solder bridge, removable conductor, attachable conductor, or as an insertable conductor. In one embodiment, jumper 129 is an electrically conductive material inserted in the hole of a printed circuit board. The insertion connects circuitry together disposed on either side of the board. In other embodiments of the invention to be described, jumper 129 is omitted and the control switch functions as a single-pole double-throw switch.

In another embodiment, light module 116 is coupled across switching element Q1 as shown by dotted line 133. The amount of light emitted by light module 116 is in inverse relation to the power level to the load. Given the inverse relationship, the lamp module serves as a locating aid for helping to locate the power control device in an otherwise darkened room.

Power control device 100 may be susceptible to damage when an overvoltage condition exceeds about a 1,000 Volts. As those of ordinary skill in the art will appreciate, overvoltages may be caused by switching transients that occur when a load on the electric circuit is turned ON or OFF. Overvoltage conditions may also be generated by lightning induced transients. Accordingly, a metal oxide varistor MOV1 is disposed between terminal 102 and terminal 102' to protect device 100 from such overvoltage conditions that may occur from time to time. MOV 1 protects the device 100 by clamping the transient voltage to a safe level, i.e., less than about 500 Volts.

Device 100 also includes an RFI filter block 162 that is configured to eliminate high frequency noise generated by series pass element Q1. RFI filter 162 includes inductors L1A, L1B, resistor R5, and capacitor C2. The functionality of filter 164 will become clearer in the discussion provided below. RC filter circuit 164 strips off random high frequency transients that are propagating in the electrical circuit. Filtering is implemented by resistor R3, R4, and C3. RC circuit 164 also phase shifts the input signal by a predetermined phase angle.

The power applied to series pass element Q1 is regulated by the variable control mechanism 166, which is implemented using potentiometer 126 (R1), trim adjustment resistor 117 (R2), resistor R4 and capacitor C1, The variable control mechanism 166 is adjusted by the user by way of the control knob switch 104 (See FIG. 27A). Of course, potentiometer 126 is the adjustable element R1 in circuit 166. An RC circuit, such as the one implemented by potentiometer 126, resistor R4, and C1, may be characterized by a time constant (τ). In this case, time constant τ corresponds to a delay between the zero-crossing of the AC signal and the firing angle of the circuit. In other words, circuit 166 is configured to turn transistor Q2 ON at a predetermined point during the AC cycle. Transistor Q2 works in concert with capacitors C1 and/or C3 in providing triac Q1 with a current high enough to turn triac Q1 ON. Thus, circuit 166 is configured to drive Q1 to cycle the power to the load ON and OFF a predetermined number of times during each AC cycle.

Trim adjustment resistor 117 is discussed in greater detail in the embodiment depicted in FIG. 30. Suffice it to say at this point that trim resistor 117 may be used to calibrate device 100 to a fan motor or adjust the minimum light intensity provided by the dimmer.

Referring back to light module 116, those of ordinary skill in the art will understand that module circuit 116 may be configured such that the amount of light emitted by the lamp assembly is either unaffected by, or related to the percentage of time that current is being supplied by the power control device to the load. The relationship may be either a direct relationship or an inverse relationship. If there is a direct relationship, the lamp module serves to indicate the amount of power being provided to the load. If there is an inverse relationship, the lamp module serves as a locating aid for helping to locate the power device in an otherwise darkened room.

The functionality of MOV 1 was discussed above. MOV 1 may be of any suitable type, but there is shown by way of example a movistor that is about 12 mm in diameter, or larger. A movistor of this size is capable of absorbing the energy levels described previously. Other surge suppression devices, such as spark gaps, gas discharge devices, capacitors, and/or zener diodes may be used in combination with MOV 1. In alternate embodiments, the aforementioned other surge suppression devices may replace MOV 1 altogether.

In an alternate embodiment of the present invention, MOV 1 is omitted and MOV 2 is disposed across the series pass element. MOV 2 protects the series pass element and other components from overvoltage conditions. MOV 2 is in series with the RFI filter (L1A, L1B, C2, and R5). Of course, with all things being equal, the amount of current propagating through MOV 2 is typically not as great as the current through MOV 1 due to the series impedance of the RFI filter. Since MOV 2 does not have to dissipate as much energy as MOV 1 due to the reduced current, MOV 2 may be a comparatively smaller than MOV 1. Accordingly, MOV 2 may be about 7 mm in diameter.

In yet another alternate embodiment, MOV 2 and MOV 1 may be used in combination. In this arrangement, MOV 2 protects the series pass element Q1 and other components, while MOV 1 protects components such as the RFI circuit.

Figure 31:
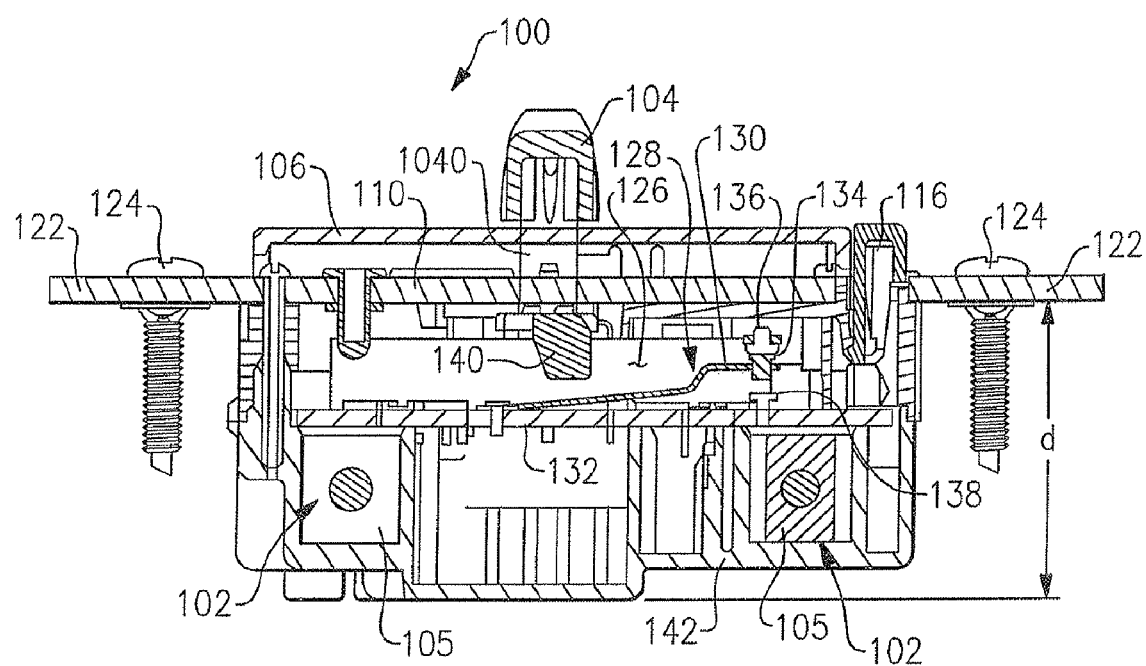
FIG. 31 is a cross-sectional side view of the power control device depicted in FIG. 27A.

Referring to FIG. 31, a cross-sectional view of the power control device depicted in FIG. 27A is shown. Dimmer control knob 104 is connected to a rectangular stem member 1040 that extends through a slot 124 formed in mounting strap/heat sink 110. The non-accessible end of the slide member 1040 is connected to switch actuator 140. Switch actuator 140 is configured to slide within potentiometer 126 to vary the displacement of slide switch 128. Control switch (slide switch) 128 includes cantilever beam 130 which is electrically connected to a printed circuit board 132. Slide switch 128 also includes contact 134 and fixed contacts 136 or 138. Fixed contacts 136, 138 are alternate embodiments that are discussed below.

If contact 136 is employed, cantilever beam 130 is pre-biased such that there is electrical connectivity between the cantilever beam and contact 136. When the user moves control knob 104 to the right, actuator 140 will eventually cause contacts 134 and 136 to separate. On the other hand, if the switch may employ contact 138. In this case, as control knob 104 is moved to the right, actuator 140 urges cantilever beam 130 to deflect toward contact 138 to establish electrical connectivity.

In an alternate embodiment, a second control switch (not shown) is disposed in device 100. The second control (slide) switch 128' is similar in structure to slide switch 128 except that it is oriented in the opposite direction. Whereas cantilever beam 130 deflects when actuator 140 is moved to the right, the cantilever beam included in control switch 128' deflects when actuator 140 moves to the left. The control switches serve to provide a full-on capability at one end of the potentiometer adjustment and full-off capability at the other end of the potentiometer adjustment. Switch 128' is coupled across switching element Q1 (see FIG. 30). Switch 128' is shown as coupled to adjustable element R1 by dotted line 127'.

The depth behind the mounting strap, represented by dimension "d" is the distance between the mounting strap and a rearward surface of rear body member 122. The dimension "d" is typically less than or equal to approximately 1.20 inches.

The cross-sectional view provided by FIG. 31 reveals that wiring terminals 102 may include screw terminals 103 (FIG. 27A) as well as pressure plates 105. Thus, device 100 may be connected to the electrical circuit by fastening the electrical wiring to terminals 102 by wrapping the wire around the shank of a terminal screw 103 and tightening the screw. Alternatively, the wire may be inserted between pressure plate 105 and the head of the terminal screw. Again, the screw is subsequently tightened causing the wire to be clamped by the plate and the screw head. Terminals 102 may also include a clip into which a wire is inserted. After inserted, the clip closes to fasten the wire to the terminal. Regardless of the method of connecting the electrical wiring to device 100, after the wiring is connected to the terminals 102, installation is completed by inserting fasteners 124 into apertures formed in the end portions 122 of strap 110.

Figure 32:
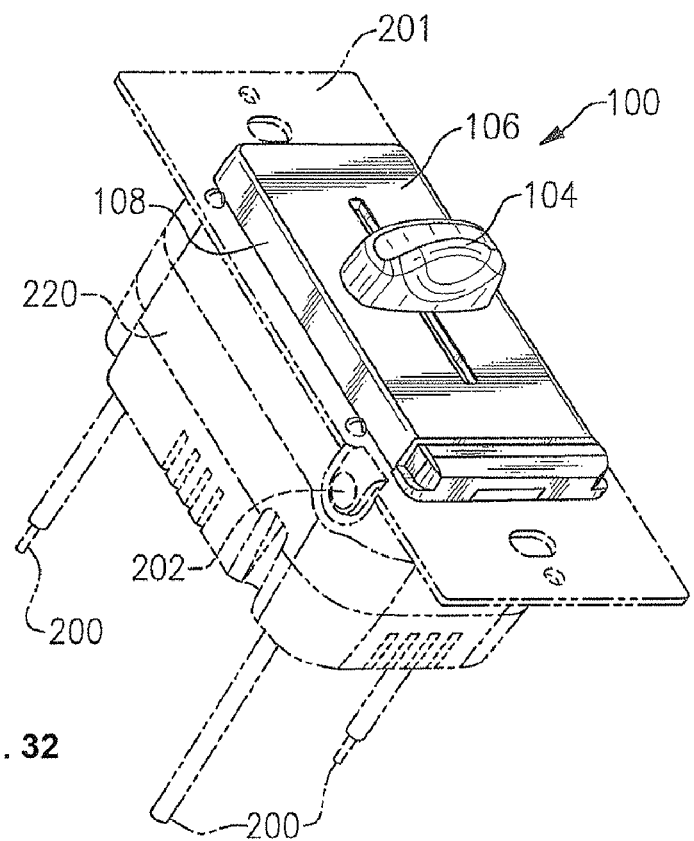
FIG. 32 is a perspective view of a power control device in accordance with a second embodiment of the present invention.

As embodied herein and depicted in FIG. 32, a perspective view of a second embodiment of the power control device 100 is shown. This embodiment is directed to a multi-position fan speed control device. Control knob 104 allows the user to select five discrete positions including OFF, LOW, MEDIUM, HIGH, and MAXIMUM. The body member 220 includes a greater interior volume than the body member 120 employed in FIG. 28. Note also that device 100 employs wire terminals 200 instead of the screw terminals provided in the first embodiment. The additional volume is required to accommodate the capacitors employed in the switching circuit (not shown). The mounting strap 201 employed in the second embodiment is similar to the heat sink 110 shown in FIG. 28. One notable exception is that mounting strap 201 does not include any removable tabs. A ground terminal 202 coupled to mounting strap 201 and disposed at an exterior location on body member 220 permits mounting strap 201 to be electrically connected to a ground wire. Since removable tabs 112 are not provided in this embodiment, ground terminal 202 may be disposed along any of the edges of mounting strap 201.

Figure 33:
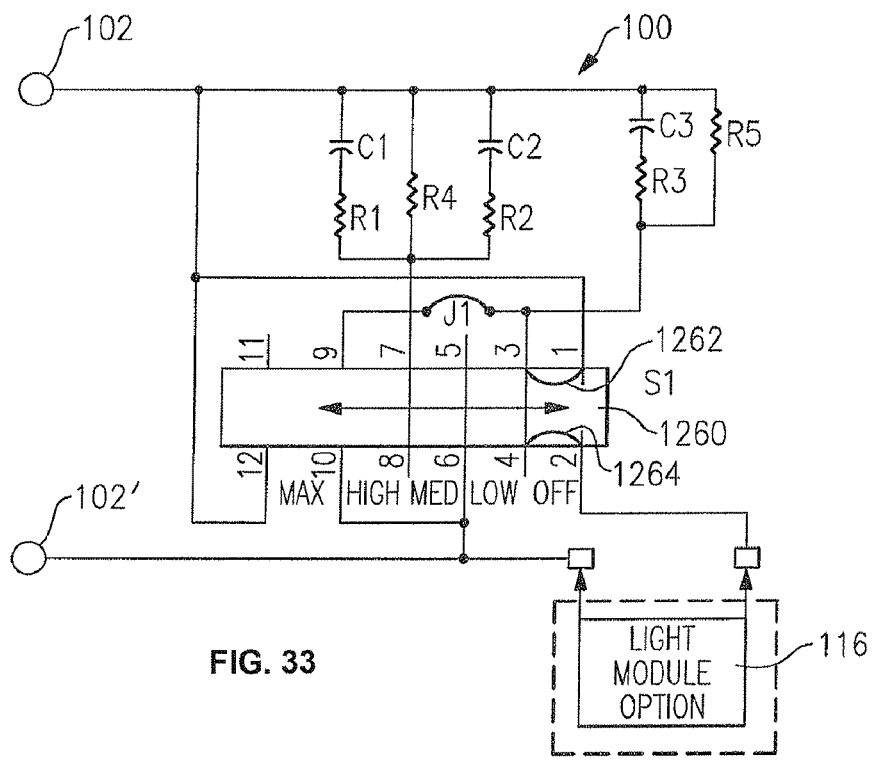
FIG. 33 is a schematic diagram of a fan speed control circuit in accordance with the embodiment depicted in FIG. 32.

Referring to FIG. 33, a schematic diagram of the multi-position fan speed control device depicted in FIG. 32 is shown. The device 100 is connected to the electrical distribution system via terminals (wires) 200. The fan motor load is coupled in series with device 100 to the source voltage of the electrical distribution system. The basis of this embodiment is discrete step switch element 1260 which is coupled to the control knob 104. Thus, control knob 104 may be employed by a user to select between any one of five positions including OFF, LOW, MED, HIGH, and MAX. As those of ordinary skill in the art will appreciate, switch element 1260 is the functional equivalent of the variable control circuit and is coupled to the series pass element. The series pass element is implemented by an RC circuit that includes capacitors C1, C2, C3.

The second embodiment of the present invention also includes a light module 116. Again, the light module 116 functions as a locator light. When switch 1260 is placed in the OFF position, current is applied to the light module 116. Light is thus emitted when device 100 is turned OFF. Thus, a person entering a darkened room may easily locate the control because the light emitted by module 116 functions as a location beacon.

Switch 1260 operates as follows. Control knob 104 is shown in the OFF position. In the OFF position, switch contacts 1 and 3 are shorted together by shorting structure 1262 and contacts 2 and 4 are shorted together by shorting structure 1264. As the switch is stepped from the OFF position to the MAX position, the bridging structures advance each time to short the next pair of adjacent terminals. When knob 104 is stepped all the way to the MAX position, contacts 9 and 11 are shorted together and contacts 10 and 12 are shorted together. At the MAX position, there is little or no impedance between terminals 200.

In an alternate embodiment, light module 116 is disposed across contacts 11 and 12 (not shown). When light module 116 is not emitting light, the user realizes that the fan is fully activated.

Figure 34:
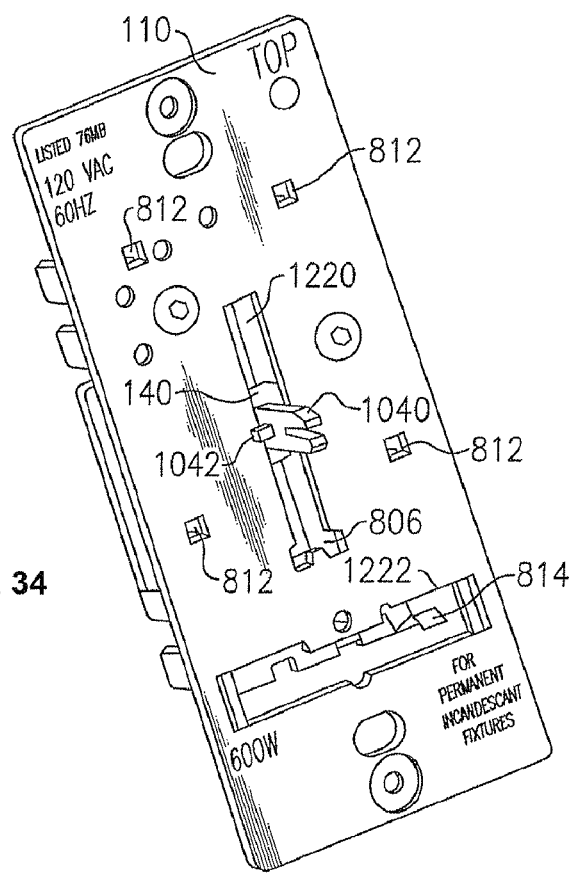
FIG. 34 is a perspective view of the mounting strap and control actuator interface depicted in FIG. 32.

Referring to FIG. 34, a detail view of the mounting strap and control actuator interface suitable for FIGS. 27-33 is shown. The user adjusts the amount of power delivered to the load by manipulating control knob 104. Control knob stem 1040 extends through slot 1220 to connect with switch actuator 140. Stabilizer element 1042 is disposed in a transverse direction relative to stem portion 1040. The stabilizer element 1042 facilitates the movement of actuator 140 along the longitudinal axis of slot 804. Stabilizer 1042 and switch actuator 140 limit the torquing motion when the control knob 104 is manipulated by the user. In the continuously variable embodiments of the present invention, a portion of actuator 140 slides within potentiometer 126. In the step-wise adjustable embodiment, control stem 1040 moves between the discrete positions provided by switch 1260.

Slot 1220 has an enlarged region 806 that permits switch actuator 140 and strap 110 to be assembled. A subsequent assembly step may add a barrier (not shown) that prevents switch actuator 140 from re-entering the enlarged region. In an alternate embodiment, the enlarged region may be omitted if the switch actuator 140 is disposed on one side of the mounting strap 110 and stabilizer 1042 is included.

Strap 110 also includes an opening 1222 that is configured to accommodate light module 116. Contact mechanism 814 is configured to engage the light module contact mechanism. If the user employs a blank module instead of a light module, contact mechanism 814 is covered by the blank module and not accessible to a user. The mounting strap 110 also includes holes 812 that accommodate the front cover snaps that are used to connect front cover 106 to the strap 110.

Figure 35A:
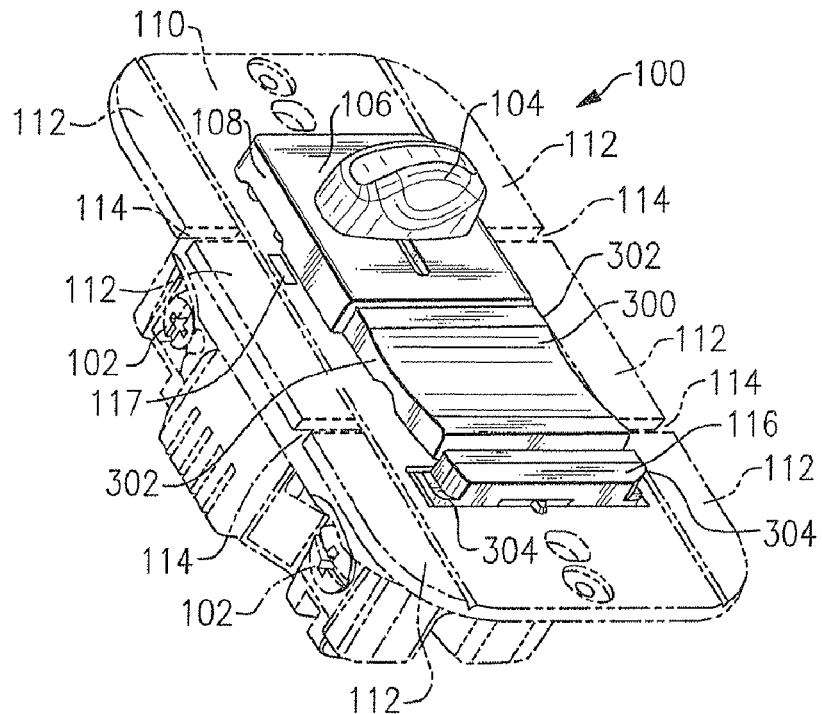
FIG. 35A is a perspective view of a power control device in accordance with a third embodiment of the present invention.

As embodied herein and depicted in FIG. 35A, a perspective view of a power control device 110 in accordance with a third embodiment of the present invention is shown. In this embodiment, the self-aligning front cover member includes the dimmer switch front portion 106 and a switch element 300. Of course, the light module 116 is disposed under the switch element 300. Each of these elements (106, 300, and 116) has a raised rectangular form factor that corresponds to a standard wall plate opening. Switch 300 also includes raised edges 302 that are configured to align with the raised edge of dimmer cover member 106 and light module 116. Raised edges 302, light module 116, and dimmer cover member 106 are configured to be flush, or slightly raised, relative to the surface of the cover plate 150.

Those of ordinary skill in the art will understand that control knob 104 may be coupled to either a continuously variable dimmer control or a variable speed fan control disposed in body member 120. Thus, switch control 106 may also be implemented as a multi-positional switch, such as a three way switch. The three-way switch may be configured to switch between an OFF position, an intermediate position, and a full ON position. The three way switch may be operatively coupled to the series pass element in the device and to a remote switch.

Switch 300 may be configured as a preset switch that is disposed in series with the variable speed dimmer or fan control. The preset switch provides device 100 with an ON/OFF control. The preset switch turns the dimmer ON at the last selected brightness level, or at a predetermined brightness level, eliminating the need for the user to find the desired setting every time the device is switched ON and OFF. This allows a user to keep control knob 104 in a desired position such that the user need only actuate switch 300 to cause device 100 to operate as it did during the last operation.

In another embodiment, switch 300 may be configured to provide ON/OFF control to a separate electrical load. Those skilled in the art understand that general purpose switches of this type that are typically employed in residential environments should be rated at either 15 Amperes or 20 Amperes, depending on the application. As shown, switch 300 toggles between positions disposed along the longitudinal axis of device 100. The directionality of switch toggling is advantageous because it avoids interference with any switches that may be disposed nearby. Alternatively, switch 300 may be configured to toggle in the transverse direction.

Device 100 includes a user accessible trim adjuster 117. Trim adjuster 117 is accessible to the user when the cover plate is removed. As noted previously, trim adjuster 117 provides a low end voltage adjustment that allows the user to set the minimum light intensity, or the minimum fan motor speed. Those of ordinary skill in the art will understand that certain electric motors tend to stall below a certain operating speed. Accordingly, trim adjuster 117 allows the user to calibrate device 100 to the fan motor. This feature may also be useful to adjust the minimum light intensity provided by the dimmer.

Figure 35B:
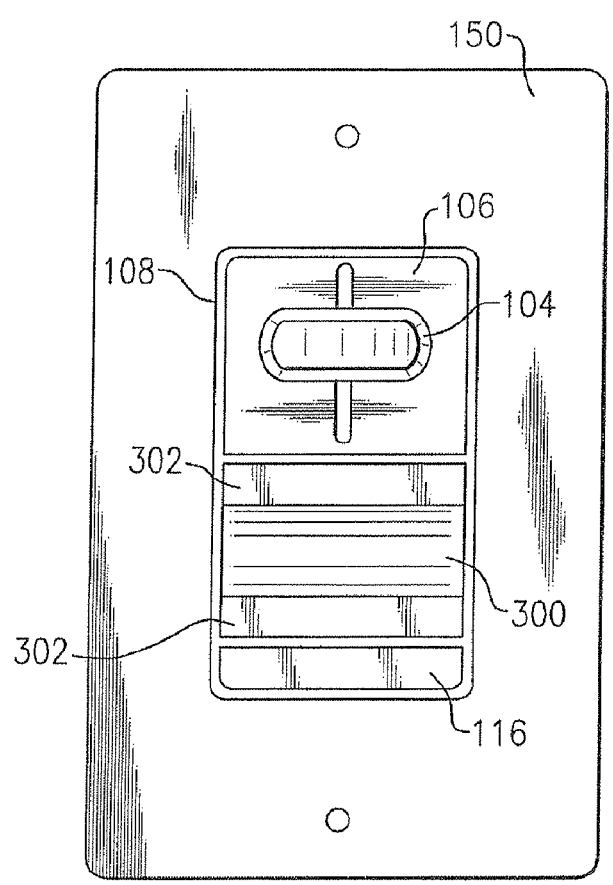
FIG. 35B is a plan view of the power control device depicted in FIG. 35A disposed in a standard wall plate.

FIG. 35B is a plan view of the power control device depicted in FIG. 35A disposed in a standard wall plate 150. Again, the frameless front cover assembly has a raised rectangular form factor that closely fits into the cover plate 150 opening. The self-aligning front cover member includes the dimmer switch front portion 106 and a switch element 300. Each of these elements (106, 300, and 116) has a raised rectangular form factor that corresponds to a standard wall plate opening. In other words, each of the aforementioned elements has a transverse dimension substantially equal to the transverse dimension of the standard wall plate opening.

The gap between wall plate 150 and cover member 106 is slightly exaggerated in FIG. 35B. The planar surface of member 106 and the raised portions 302 are flush with the exposed surface of the wall plate. Accordingly, the cover plate cannot interfere with the actuation of the control knob 104 or switch member 300. Furthermore, there are no inaccessible crevices or recessed surfaces that inhibit cleaning. Again, the term "standard wall plate" is defined herein as a wall plate that conforms to the dimensions provided by the ANSI/NEMA WD6 standard.

Figure 36:
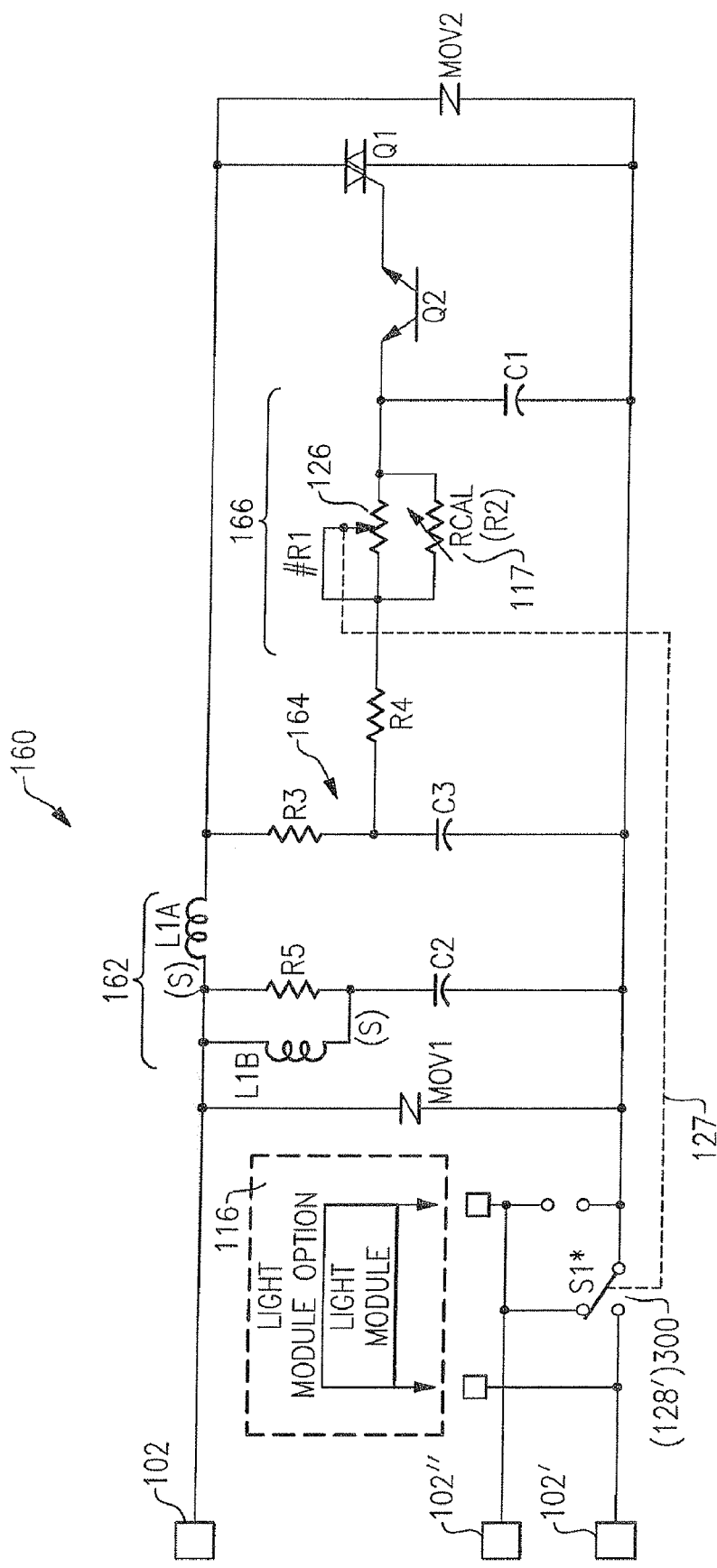
FIG. 36 is a schematic diagram of the power control device shown in FIG. 35A.

As embodied herein and depicted in FIG. 36, a schematic diagram for the power control device depicted in FIG. 35A is shown. The schematic diagram of FIG. 36 is almost identical to the diagram shown in FIG. 30. The exception is that a single-pole double-throw is included. In one embodiment, the single-pole double-throw switch is a control switch 128'. Control switch 128' is operatively coupled to adjustable element R1. The coupling is denoted by dotted line 127. Terminals 102' and 102" are electrically connected to fixed contacts 136 and 138 (see FIG. 28.) Also, terminals 102' and 102" are connected to like terminals in a remotely located switch. The two switches are interconnected to allow power to the load to be switched OFF and ON by either switch. This is commonly referred to as a three-way switching scheme. Light module 116 is coupled to switch 128' so as to emit light whenever power is not being provided to the load.

In an alternate embodiment, the single-pole double-pole switch is the preset switch 300. Of course, preset switch 300 and the adjustable element are independently operable, (dotted line 127 is omitted in this embodiment.)

The load is coupled to the source voltage by way of terminal 102 and one of terminals 102', 102" which are selected by operation of preset switch 300 (S1). In contrast to a control switch, a preset switch is not coupled to adjustable element R1. Dashed line 304 illustrates the connection between the preset switch 300 and potentiometer 126. Switch 300 is configured to turn the power control circuit 1600N or OFF. Light module 116 functions as a locator light element. When preset switch 300 is OFF the light module 116 is energized. If preset switch 300 is ON, the circuit is energized and light module 116 does not emit light.

Figure 37:
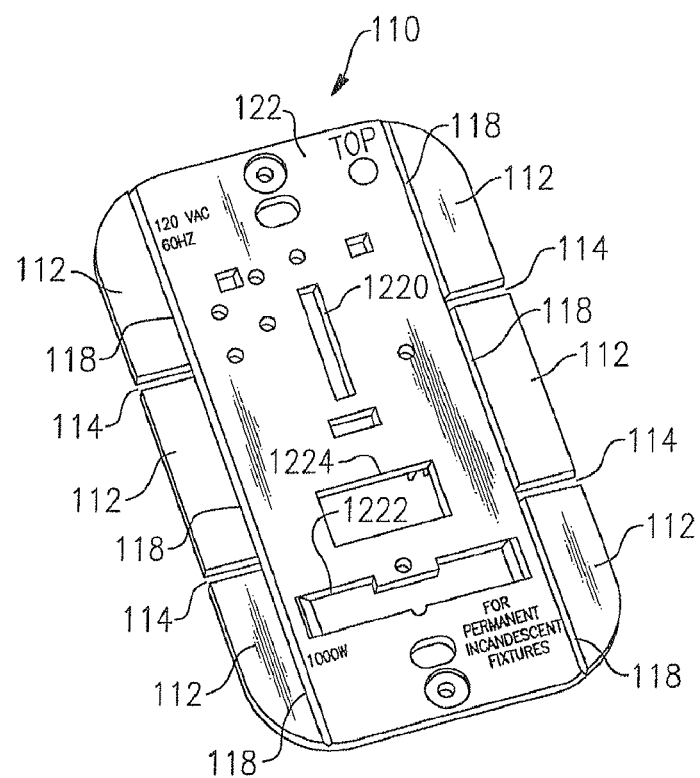
FIG. 37 is a top view of the heat sink mounting strap depicted in FIG. 35A.

As embodied herein and depicted in FIG. 37, a plan view of the heat sink 110 depicted in FIGS. 35-36 is shown. Like the heat sink member shown in FIGS. 28-29, all of the elements of heat sink 110 are disposed in a single plane. Heat sink 110 includes a central portion 122 that includes several apertures 1220, 1222, 1224 that are formed to accommodate the control knob stem 1040, switch 300, and light module 1116, respectively. An upset line 118 extends along each longitudinal side of heat sink 110 separating interior portion 122 from removable tabs 112. Tabs 112 are segmented by forming linear gaps 114 extending between the longitudinal edges of the heat sink and upset lines 118. Upsets 118 may be implemented using scored lines, perforations, notches, and/or similar features. Unlike conventional designs, there are no gaps along the longitudinal axis between heat sink 110 and tabs 112. The innovation results in superior thermal conductivity between portion 122 and tabs 112.

The segmented break-off tabs are easier to remove than a single tab disposed along the longitudinal edge of heat sink 110. Further, the segmented tabs allow for the removal of a single tab in the event that it is necessary to only remove a single tab from proper device installation. Accordingly, the remaining tabs are left in place to provide optimal heat-sinking functionality.

It will be apparent to those of ordinary skill in the pertinent art that modifications and variations can be made to strap/heat sink 110 of the present invention depending on cost, manufacturability, and heat conduction characteristics. Accordingly, heat sink 110 may be fabricated using a conductive material such as aluminum or steel. The material may be plated, anodized, black anodized, or similarly processed.

Figure 38:
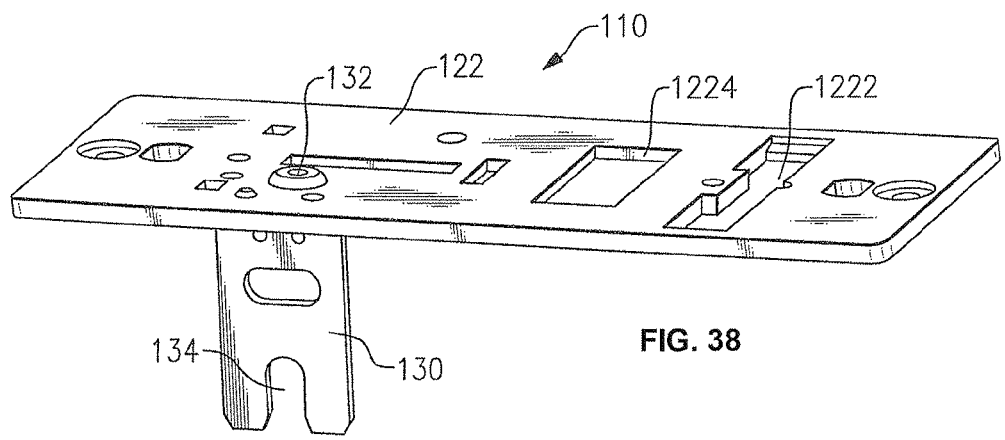
FIG. 38 is a side perspective view of the heat sink depicted in FIG. 37.

Referring to FIG. 38, a side perspective view of the heat sink assembly 110 depicted in FIG. 37 is shown. With the exception of aperture 1224, this embodiment is identical to the embodiment depicted in FIG. 29.

Figure 39:
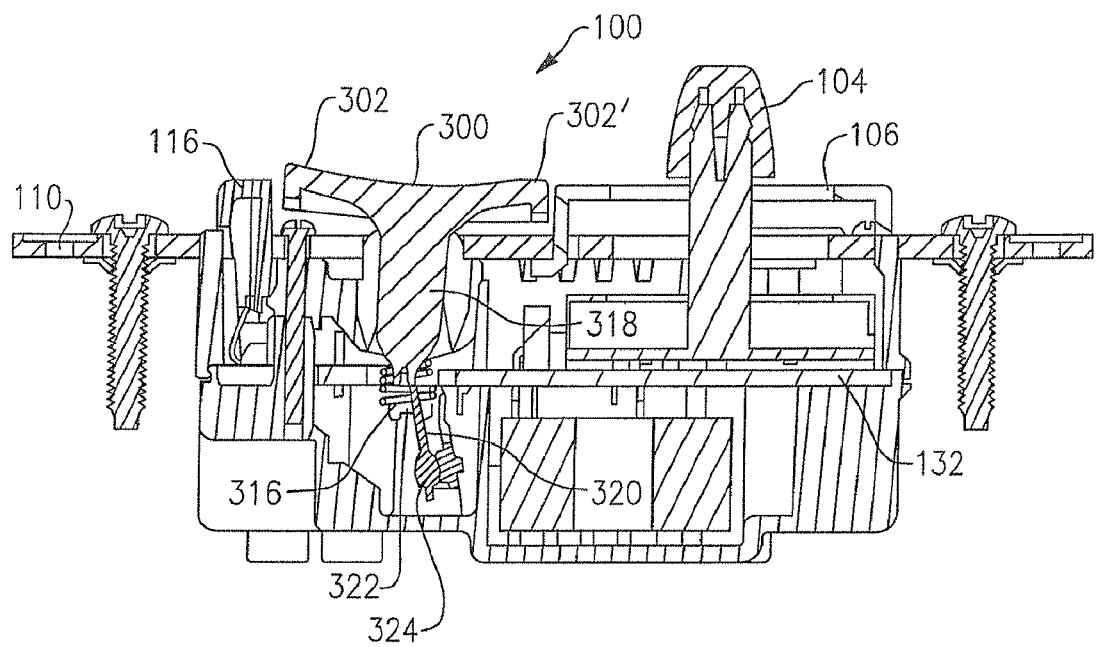
FIG. 39 is a cross-sectional view of the device shown in FIG. 35A.

Referring to FIG. 39, a cross-sectional view of the device 100 depicted in FIG. 35A is shown. The dimmer portion 106 disposed adjacent to the switch button 300 is a smaller version of the dimmer switch fully described above.

The preset switch 300 toggles between an ON position and an OFF position represented by raised surfaces 302, 302'. Raised surfaces 302, 302' are used to actuate the switch between the two positions. Those of ordinary skill in the art will understand that switch 300 may be implemented using any suitable form factor that provides the user with the ability to toggle between the two positions. For example, switch 300 may be in the shape of a lever (not shown) wherein the two tactile surfaces are disposed on opposite sides of the lever. Switch 310 may be a push button switch. In this embodiment, each depression of the push button toggles the switch from one position into the other.

Switch 300 includes an actuator arm 318 that extends into the interior of device 100. A center bias spring 316 applies force to actuator arm 318 such that a snapping action occurs when switch 310 is toggled between the ON and OFF switch positions. Actuator arm 318 is also coupled to pivot member 320. Pivot member 320 rotates in cradle member 322 under the guidance of actuator arm 318.

Figure 40:
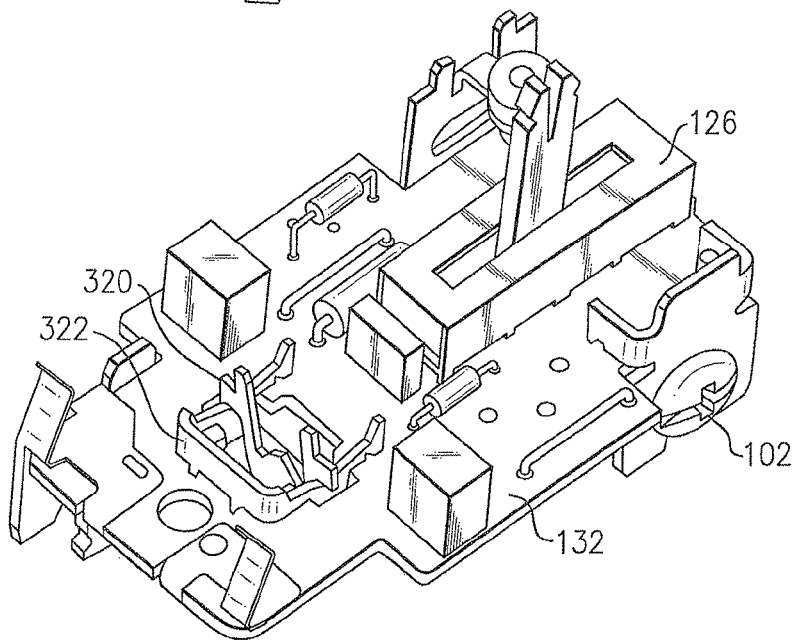
FIG. 40 is a perspective view of a portion of the printed circuit board assembly depicted in FIG. 30.

Referring to FIG. 40, a detail perspective view of the printed circuit board assembly employed in the embodiment of FIG. 35A. FIG. 40 shows in pivot member 320 disposed in the cradle member 322. Cradle member 322 is fastened to printed circuit board 132. Cradle member 322 allows pivot member 320 to rotate the switch between the ON/OFF positions. Pivot member 320 and cradle member 322 are electrically conductive. The terminal 102 may be connected to the cradle by way of a printed circuit board trace.

The printed circuit board 132 also accommodates most of the other electrically active components in device 100 including potentiometer 126, switch 128, the series pass element Q1, and electrical components coupled to the series pass element. Other electrical components mounted to the circuit board 132 include surface mount components disposed on one or both sides of printed circuit board 132, and/or leaded (through hole) components.

Figure 41:
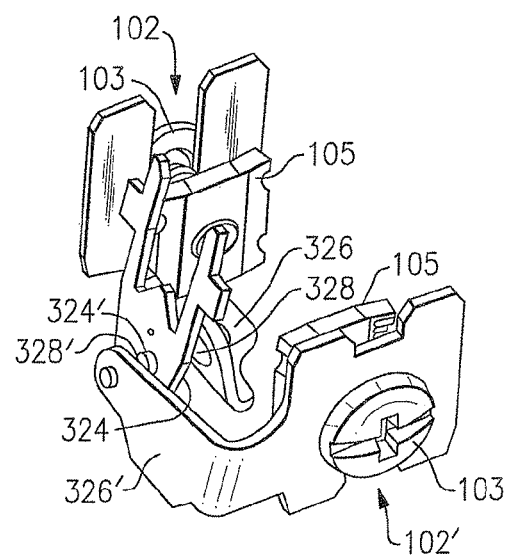
FIG. 41 is a detail view of the paddle switch mechanism depicted in FIG. 30.

FIG. 41 is a detail view of the paddle switch mechanism shown in FIG. 40 is disclosed. In particular, FIG. 41 shows the connectivity between pivot member 320 and the terminals 102. While pivot 320 is disposed within the device body, the terminal members 102, 102' and/or pressure plates 105 are disposed on either side of device 100 and accessible to the user. Each of the terminals 102, 102' include arms 326, 326' that extend perpendicularly into the interior of device 100. Each arm 326, 326' includes a fixed contact 328, 328' that is aligned with a movable contact 324, 324' disposed on pivot member 320. Of course, contact 324 is hidden behind member 320 in the view provided by FIG. 41. Pivot member 320 rotates between arm 326 and arm 326' depending on which raised surface 302, 302' on switch 300 is depressed.

Electrical contacts (324, 328) may not be necessary for pre-set switches since they are typically rated about 8 Amperes or less. Electrical connectivity between the common terminal and one or the other of the stationary terminals relies on contact between a surface of one or the other arm 326 and pivot member 322. Such surfaces may be plated surfaces, e.g. plated silver surfaces.

Figure 42:
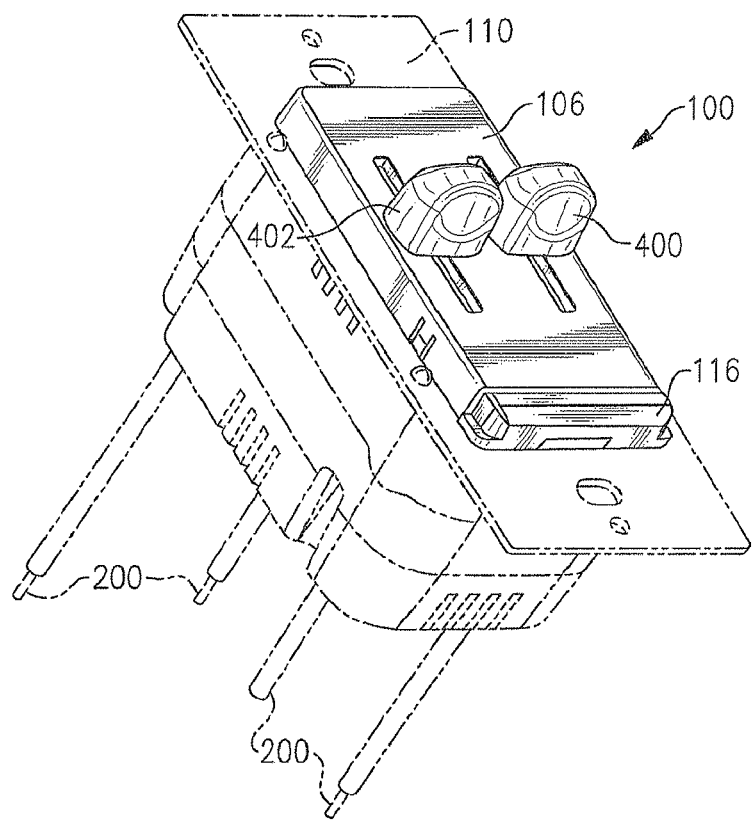
FIG. 42 is a perspective view of a power control device in accordance with a fourth embodiment of the present invention.

As embodied herein and depicted in FIG. 42, a perspective view of a fourth embodiment of the present invention is shown. Device 100 includes two independently operable control knobs 400, 402. Thus, power control device 100 may be employed to operate two dimmers, a fan speed control and a dimmer, a heating control and a dimmer, among other combinations. Device 100 may be equipped with two triacs thermally coupled to heat sink 110.

Figure 43:
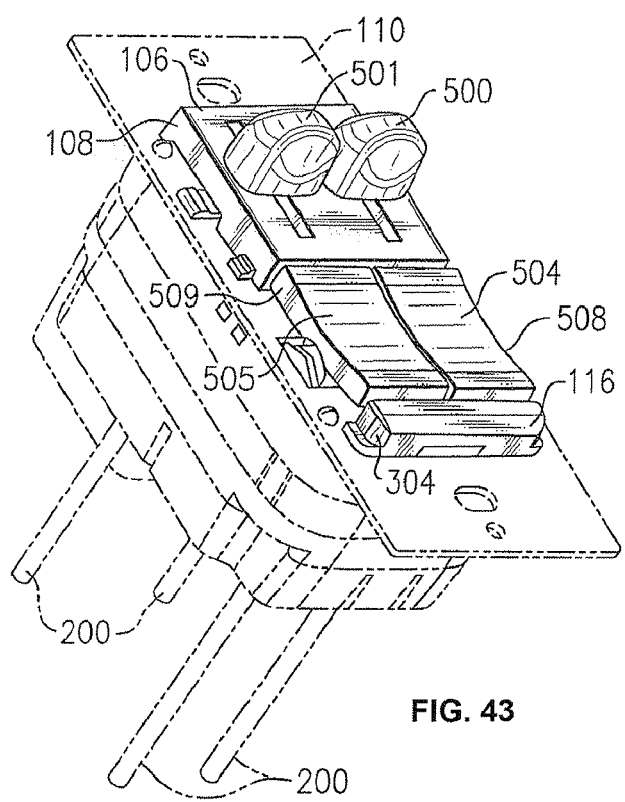
FIG. 43 is a perspective view of a power control device in accordance with a fifth embodiment of the present invention.

As embodied herein and depicted in FIG. 43, a perspective view of a fifth embodiment of the present invention is shown. In this embodiment, device 100 includes two sets of power controls. The first set includes adjustable control knob 500 and its corresponding preset switch 504. The second combination includes control knob 501 and its corresponding preset switch 505. In one embodiment, control knob 500 is configured as be actuated between multiple discrete positions. For example, control knob 500 may be moved between three fan speeds. Of course, those of ordinary skill in the art will understand that switch 500 may also be configured as a five speed control mechanism. Paddle switch 504 is the preset switch and is actuated between the ON and the OFF position. Control knob 501 may be employed as a control mechanism for a continuously variable dimmer switch. Corresponding paddle switch 505 is also a preset switch and turns the dimmer circuit ON/OFF. Those of ordinary skill in the art will understand that device 100 may be suitable for controlling two dimmers, a fan speed control and a dimmer, a heating control and a dimmer, or other such device combinations and pairings. In one embodiment, device 100 is equipped with two triacs thermally coupled to heat sink 110.

In another embodiment of the present invention, paddle switches 504 and 505 are decoupled from control knobs 500 and 501, respectively. Thus, device 100 may be configured to control two, three, or four individual electrical loads depending on whether the paddles switches (504, 505) are placed in series with their corresponding variably adjustable switch (500, 501). As used herein, the term "general purpose switch" is used to describe a switch that is coupled to an electrical load that is not coupled to the power controller. A power control device may include one or more of general purpose switches, preset switches, or control switches. These switch types may also be employed in combination as required.

This embodiment is also equipped with a light module, a removable light module, or a blank member, each designated as reference element 116 in the Figures. The raised form factor of module 116, switches 504, 505, and switch cover 106 are configured to provide an alignment during cover plate installation in the manner previously described.

Figure 44:
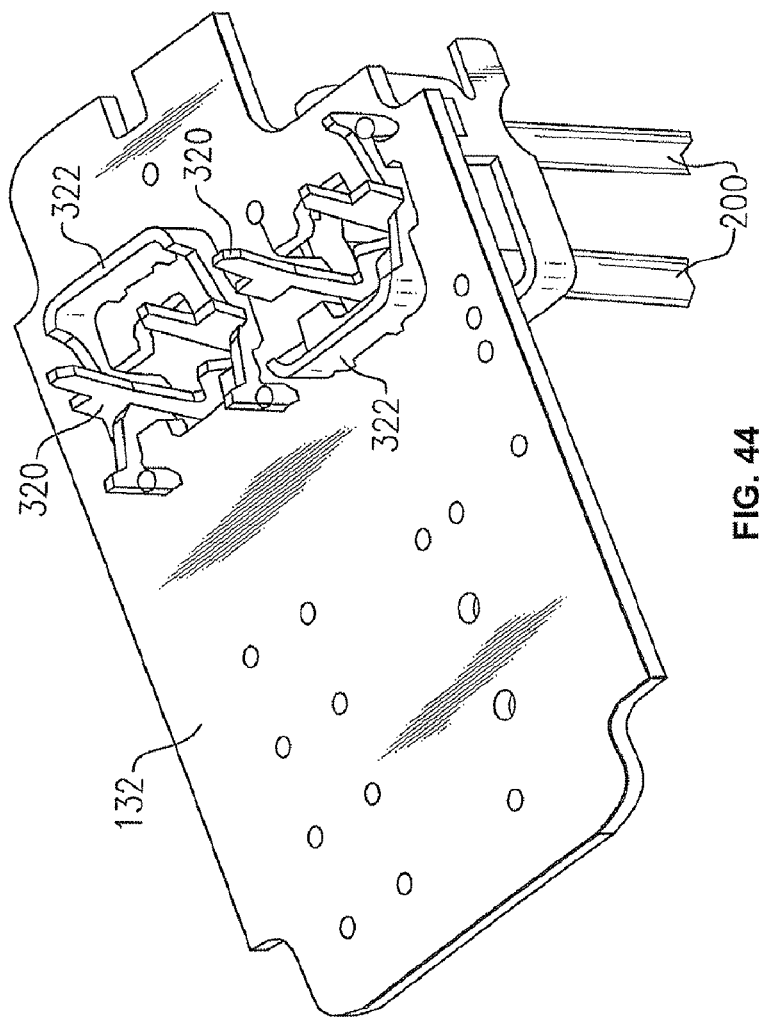
FIG. 44 is a detail view of the paddle switch mechanism depicted in FIG. 43.
Figure 45:
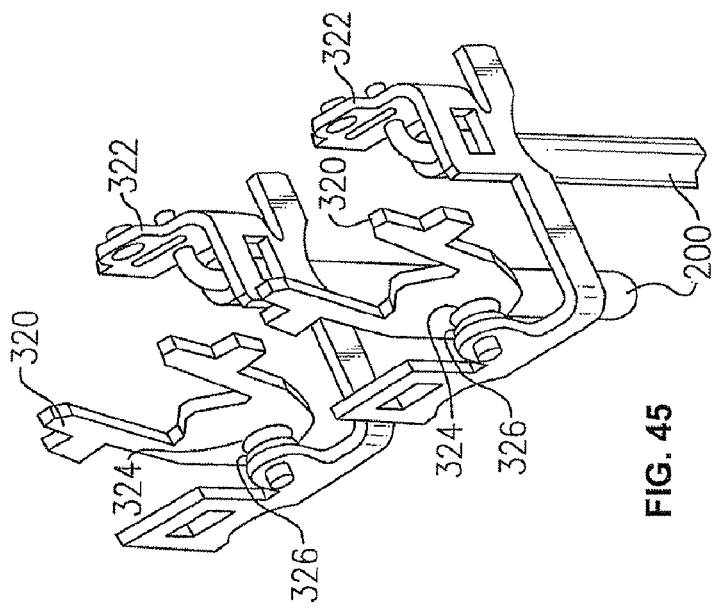
FIG. 45 is a perspective view of a portion of the printed circuit board assembly depicted in FIG. 44.

FIGS. 44-45 are detail views of the dual switch embodiment depicted in FIG. 43. In this embodiment there is only a single stationary terminal associated with each switch, i.e., both switches are on-off (single pole-single throw) switches. The switch is connected to a circuit during installation by way of wire leads 200 instead of by way of screw terminals. In an alternate embodiment (not shown) pivot members 320 are disposed within a single, unified cradle 322'. The terminal connected to the unified cradle is common to the two switches. In an alternate embodiment, at least one of the switches is a three-way switch.

Figure 46:
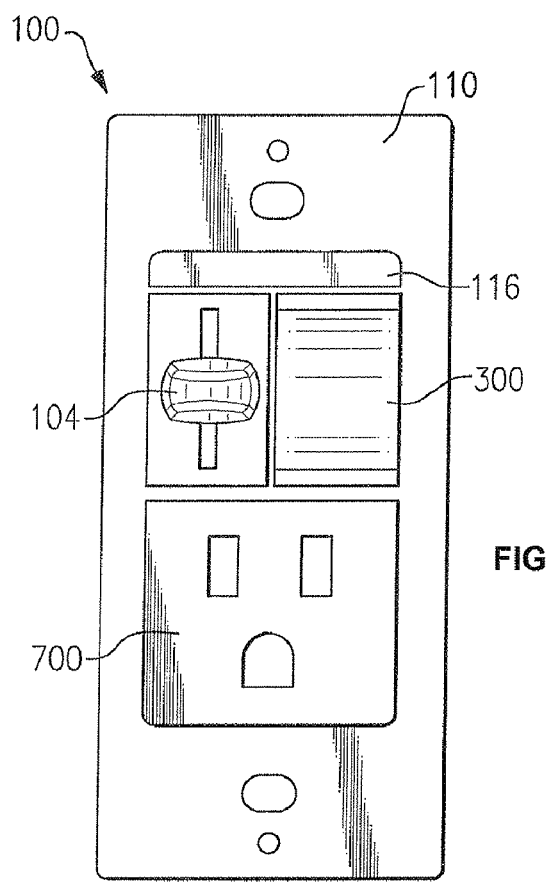
FIG. 46 is a plan view of a power control device in accordance with a sixth embodiment of the of the present invention.

As embodied herein and depicted in FIG. 46, a plan view of a sixth embodiment of the power control device of the present invention is shown. This embodiment is similar to previous embodiments, except that a receptacle outlet 700 is included in the lower portion of the device 100. Receptacle outlet 700 is coupled to the source voltage. Receptacle outlet 700 includes electrical contacts configured to permit electrical engagement of a plug by a user that in turn provides power to a user attachable load. Switch 300 may be wired as a preset switch, a switch wired to an independent load, or as a switch in series with the receptacle outlet 700. Modular lamp assembly 116 is included in device 100. As mentioned above, module 116 may be configured as a pilot light, a locator light, a night light, or to perform any of the other previously described light module functions.

Figure 47:
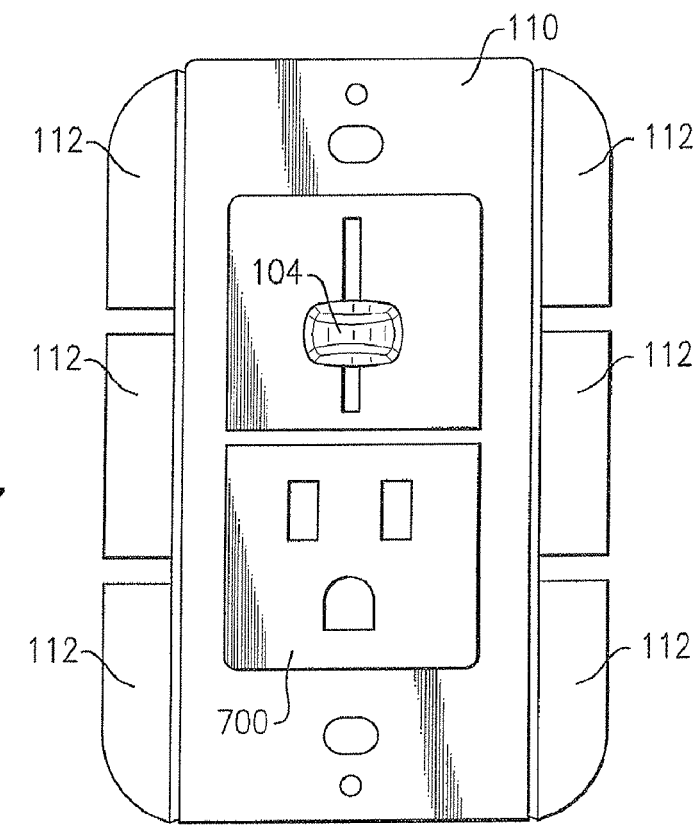
FIG. 47 is a plan view of a power control device in accordance with a seventh embodiment of the present invention.

Referring to FIG. 47, a plan view of a seventh embodiment of the power control device of the present invention is shown. This embodiment is similar to the embodiment shown in FIG. 42 except that switch 300 and modular lamp assembly 116 have been omitted and heat sink tabs 112 have been included.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An electrical wiring system for use in an AC electrical power distribution circuit including at least one upstream AC power conductor disposed between an upstream AC power distribution element and a device box and at least one downstream AC power conductor disposed between the device box and at least one load disposed downstream from the device box, the at least one upstream AC power conductor and the at least one downstream AC power conductor being routed into an interior portion of the device box and accessible via a front open face of the device box, the system comprising:

an electrical wiring device including a device housing having a front portion and a back body portion, the back body portion including a rear major surface, the front portion including a heat sink and at least one user-accessible control element, the at least one user-accessible control element being coupled to a power regulation circuit, the power regulation circuit being thermally coupled to the heat sink and electrically coupled to a plurality of device contacts, the power regulation circuit being substantially disposed in a first interior region between the heat sink and the back body portion, the plurality of device contacts being provided by an electrical interface accessible via the back body portion, the electrical interface being substantially disposed in a second interior region between the heat sink and the back body portion adjacent the first interior region, the power regulation circuit being configured to regulate an amount of power directed from the upstream AC power distribution element to the at least one load in response to at least one control input provided by the at least one user-accessible control element; and a connector device including a connector housing having a first connector housing portion and a second connector housing portion, the first connector housing portion including a plurality of connector contacts disposed therein, the plurality of connector contacts being mated with the plurality of device contacts when the first connector housing portion is coupled to the electrical interface, the connector housing including a plurality of termination structures coupled to the plurality of connector contacts, the plurality of termination structures being configured to couple the at least one upstream AC power conductor and the at least one downstream AC power conductor to corresponding contacts of the plurality of connector contacts, the second connector housing portion being substantially parallel to the rear major surface of the back body portion when the first connector housing portion is coupled to the electrical interface.

2. The system of claim 1, wherein the at least one at least one user-accessible control element includes at least one switch mechanism.

3. The system of claim 1, wherein the heat sink is substantially planar such that a distance from a major surface of the heat sink to a rear major surface of the connector housing is less than or equal to approximately 1.20 inches.

4. The system of claim 1, wherein the at least one at least one user-accessible control element is selected from a group of control elements that includes a toggle switch actuator, a paddle switch actuator, a push button switch, or a variable slide switch.

5. The system of claim 1, wherein the at least one user-accessible control element includes a dimmer mechanism coupled to a push button switch mechanism.

6. The system of claim 1, wherein the power regulation circuit includes an RFI filter circuit coupled to a current regulation component, the RFI filter circuit being configured to substantially prevent high frequency noise generated by the current regulation component from propagating in the at least one upstream AC power conductor or the at least one downstream AC power conductor.

7. The system of claim 6, wherein the RFI filter circuit includes an RLC circuit.

8. The system of claim 6, wherein the RFI filter circuit includes a plurality of inductors.

9. The system of claim 1, wherein the at least one at least one user-accessible control element includes a dimmer mechanism coupled to at least one switch mechanism.

10. The system of claim 9, wherein the at least one switch element includes a preset switch configured to turn the at least one load ON and OFF, the amount of power directed from the upstream AC power distribution element to the at least one load being determined by a preset setting determined by the dimmer mechanism.

11. The system of claim 9, wherein the at least one user-accessible control element includes a trim adjustment mechanism coupled to the dimmer mechanism, the trim adjustment mechanism being configured to provide an adjustable minimum setting, the adjustable minimum setting determining a minimum amount of power directed from the upstream AC power distribution element to the at least one load.

12. The system of claim 1, wherein the heat sink includes a substantially planar portion coupled to a ground tab portion, the ground tab portion having a substantially lower thermal conductivity than the substantially planar portion.

13. The system of claim 12, wherein the electrical interface includes the ground tab portion.

14. The system of claim 12, wherein an operating temperature of the ground tab portion is less than an operating temperature of the substantially planar portion.

15. The system of claim 14, wherein an operating temperature of the ground tab portion is less than approximately 75% of an operating temperature of the substantially planar portion.

16. The system of claim 1, wherein the device further comprises a lighting module removably disposed in the front portion and coupled to the at least one at least one user-accessible control element.

17. The system of claim 16, wherein the at least one at least one user-accessible control element includes a switch element configured to turn the lighting module or the power regulation circuit between an ON position and an OFF position.

18. The system of claim 1, wherein the plurality of connector contacts includes a line contact, a ground contact and at least one load contact.

19. The system of claim 18, further comprising a pull switch device including a plurality of shorted contacts, the pull switch device being used with the connector device in place of the electrical wiring device, the pull switch device being coupled to the connector device such that the line contact and the at least one load contact are shorted together.

20. An electrical wiring system for use in an AC electrical power distribution circuit including at least one upstream AC power conductor disposed between an upstream AC power distribution element and a device box and at least one downstream AC power conductor disposed between the device box and at least one load disposed downstream from the device box, the at least one upstream AC power conductor and the at least one downstream AC power conductor being routed into an interior portion of the device box and accessible via a front open face of the device box, the system comprising:

an electrical wiring device including a device housing having a front portion and a back body portion, the front portion including a heat sink and at least one user-accessible control element, the at least one user-accessible control element being coupled to a power regulation circuit thermally coupled to the heat sink and electrically coupled to a plurality of device contacts, the plurality of device contacts being disposed in an electrical interface formed in the back body portion, the power regulation circuit including an RFI filter circuit coupled to a current regulation component, the RFI filter circuit being configured to substantially prevent high frequency noise generated by the current regulation component from propagating on the at least one upstream power conductor or the at least one downstream AC power conductor, the RFI filter including dual inductive coils characterized by a predetermined impedance, the power regulation circuit being configured to regulate an amount of power directed from the upstream AC power distribution element to the at least one load in response to at least one control input provided by the at least one user-accessible control element; and a connector device including a connector housing having a plurality of connector contacts disposed therein, the plurality of connector contacts being coupled to a plurality of termination structures, the plurality of termination structures being configured to couple the at least one upstream AC power conductor and the at least one downstream AC power conductor to corresponding contacts of the plurality of connector contacts, the plurality of connector contacts being mated with the plurality of device contacts when the connector housing is coupled to the electrical interface.

21. The system of claim 20, wherein the at least one user-accessible control element includes at least one switch mechanism.

22. The system of claim 20, wherein the at least one user-accessible control element is selected from a group of control elements that includes a toggle switch actuator, a paddle switch actuator, a push button switch, or a variable slide switch.

23. The system of claim 20, wherein the device further comprises a lighting module removably disposed in the front portion and coupled to the at least one user-accessible control element, and wherein the at least one user-accessible control element includes a switch element configured to turn the lighting module or the power regulation circuit between an ON position and an OFF position.

24. The system of claim 20, wherein the power regulation circuit is substantially disposed in a first interior region between the heat sink and the back body portion, the electrical interface being substantially disposed in a second interior region between the heat sink and the back body portion adjacent the first interior region.

25. The system of claim 20, wherein the at least one user-accessible control element includes a dimmer mechanism coupled to a push button switch mechanism.

26. The system of claim 20, wherein the at least one user-accessible control element includes a dimmer mechanism coupled to at least one switch mechanism.

27. The system of claim 26, wherein the at least one switch element includes a preset switch configured to turn the at least one load ON and OFF, the amount of power directed from the upstream AC power distribution element to the at least one load being determined by a preset setting determined by the dimmer mechanism.

28. The system of claim 27, wherein the at least one user-accessible control element includes a trim adjustment mechanism coupled to the dimmer mechanism, the trim adjustment mechanism being configured to provide an adjustable minimum setting, the adjustable minimum setting determining a minimum amount of power directed from the upstream AC power distribution element to the at least one load.

29. The system of claim 20, wherein the heat sink is substantially planar such that a distance from a major surface of the heat sink to a rear major surface of the connector housing is less than or equal to approximately 1.20 inches.

30. The system of claim 29, wherein the heat sink includes a substantially planar portion coupled to a ground tab portion, the ground tab portion having a substantially lower thermal conductivity than the substantially planar portion.

31. The system of claim 30, wherein an operating temperature of the ground tab portion is less than approximately 75% of an operating temperature of the substantially planar portion.

32. The system of claim 30, wherein the electrical interface includes the ground tab portion.

33. The system of claim 20, wherein the connector housing includes a first connector housing portion and a second connector housing portion, the first connector housing portion including the plurality of connector contacts and the second connector housing portion including the plurality of termination structures coupled to the plurality of connector contacts, the plurality of connector contacts being mated with the plurality of device contacts when the first connector housing portion is coupled to the electrical interface.

34. The system of claim 33, wherein portions of the at least one first AC power conductor and the at least one second AC power conductor proximate the back body portion being substantially parallel to the back body portion when the first connector housing portion is coupled to the electrical interface.

35. The system of claim 20, wherein the plurality of connector contacts includes a line contact, a ground contact and at least one load contact.

36. The system of claim 35, further comprising a pull switch device including a plurality of shorted contacts, the pull switch being used with the connector device in place of the electrical wiring device, the pull switch being coupled to the connector device such that the line contact and the at least one load contact are shorted together.

37. The system of claim 20, further comprising a secondary device including a plurality of secondary device contacts that are shorted together under a predetermined condition, the secondary device being usable with the connector device in place of the electrical wiring device such that the at least one line contact and the at least one load contact are shorted together when the predetermined condition is extant.

38. The system of claim 37, wherein the secondary device is a pull switch in which the predetermined condition is a permanent short between the plurality of surrogate contacts.

39. An electrical wiring system for use in an AC electrical power distribution circuit including at least one upstream AC power conductor disposed between an upstream AC power distribution element and a device box and at least one downstream AC power conductor disposed between the device box and at least one load disposed downstream from the device box, the at least one upstream AC power conductor and the at least one downstream AC power conductor being routed into an interior portion of the device box and accessible via a front open face of the device box, the system comprising:

an electrical wiring device including a device housing having a front portion and a back body portion, the front portion including a heat sink and at least one user-accessible control element having at least one switch element, the at least one user-accessible control element being coupled to a power regulation circuit, the power regulation circuit being thermally coupled to the heat sink and electrically coupled to a plurality of device contacts provided by an electrical interface formed in the back body portion, the device further comprising a lighting module coupled to the power regulation circuit and removably disposed in the front portion, the power regulation circuit being configured to regulate an amount of power directed from the upstream AC power distribution element to the at least one load in response to at least one control input provided by the at least one user-accessible control element; and a connector device including a connector housing having a plurality of connector contacts disposed therein, the plurality of connector contacts being coupled to a plurality of termination structures, the plurality of termination structures being configured to couple the at least one upstream AC power conductor and the at least one downstream AC power conductor to corresponding contacts of the plurality of connector contacts, the plurality of connector contacts being mated with the plurality of device contacts when the connector housing is coupled to the electrical interface.

40. The system of claim 39, wherein the at least one user-accessible control element includes a dimmer mechanism coupled to a push button switch mechanism.

41. The system of claim 39, wherein the power regulation circuit includes an RFI filter circuit coupled to a current regulation component, the RFI filter circuit being configured to substantially eliminate high frequency noise generated by the current regulation component from propagating on the at least one upstream AC power conductor or the at least one downstream AC power conductor.

42. The system of claim 41, wherein the RFI filter circuit includes an RLC circuit.

43. The system of claim 41, wherein the RFI filter circuit includes a plurality of inductors.

44. The system of claim 41, wherein the power regulation circuit is substantially disposed in a first interior region between the heat sink and the back body portion, the electrical interface being substantially disposed in a second interior region between the heat sink and the back body portion adjacent the first interior region.

45. The system of claim 41, wherein the connector housing includes a first connector housing portion and a second connector housing portion, the first connector housing portion including the plurality of connector contacts and the second connector housing portion including the plurality of termination structures coupled to the plurality of connector contacts, the plurality of connector contacts being mated with the plurality of device contacts when the first connector housing portion is coupled to the electrical interface.

46. The system of claim 45, wherein portions of the at least one first AC power conductor and the at least one second AC power conductor proximate the back body portion are substantially parallel to a rear major surface of the back body portion when the first connector housing portion is coupled to the electrical interface.

47. The system of claim 39, wherein the plurality of connector contacts includes a line hot contact, a ground contact and at least one traveler contact.

48. The system of claim 47, further comprising a pull switch device including a plurality of shorted contacts, the pull switch being used with the connector device in place of the electrical wiring device, the pull switch being coupled to the connector device such that the line hot contact and the at least one traveler contact are shorted together.

49. The system of claim 39, further comprising a secondary device including a plurality of secondary device contacts that are shorted together under a predetermined condition, the secondary device being usable with the connector device in place of the electrical wiring device such that the at least one line contact and the at least one load contact are shorted together when the predetermined condition is extant.

50. The system of claim 49, wherein the secondary device is a pull switch in which the predetermined condition is a permanent short between the plurality of surrogate contacts.

* * * * *